US012463602B2

(12) United States Patent
Oshita

(10) Patent No.: US 12,463,602 B2
(45) Date of Patent: Nov. 4, 2025

(54) HIGH-FREQUENCY MODULE AND COMMUNICATION DEVICE

(71) Applicant: Murata Manufacturing Co., Ltd., Kyoto (JP)

(72) Inventor: Teruaki Oshita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 547 days.

(21) Appl. No.: 17/938,769

(22) Filed: Oct. 7, 2022

(65) Prior Publication Data

US 2023/0035978 A1 Feb. 2, 2023

Related U.S. Application Data

(63) Continuation of application No. PCT/JP2021/015749, filed on Apr. 16, 2021.

(30) Foreign Application Priority Data

May 27, 2020 (JP) .................... 2020-092377

(51) Int. Cl.
*H03F 3/195* (2006.01)
*H03F 1/56* (2006.01)

(52) U.S. Cl.
CPC ............. *H03F 3/195* (2013.01); *H03F 1/56* (2013.01); *H03F 2200/451* (2013.01)

(58) Field of Classification Search
CPC .......... H03H 9/0542; H03H 7/38; H03H 9/64; H03H 9/725; H03H 9/0566; H03H 7/46;

(Continued)

(56) References Cited

U.S. PATENT DOCUMENTS 10,938,436 B2 * 3/2021 Naniwa .................... H03F 3/19
2016/0037640 A1 * 2/2016 Takai .................. H05K 1/0298
361/753

(Continued)

FOREIGN PATENT DOCUMENTS

JP 2009-153071 A 7/2009
WO 2017/199690 A1 11/2017

(Continued)

OTHER PUBLICATIONS

International Search Report for PCT/JP2021/015749 dated Jun. 1, 2021.

*Primary Examiner* — John W Poos
(74) *Attorney, Agent, or Firm* — McDonald Hopkins LLC

(57) ABSTRACT

To achieve miniaturization. A matching circuit is connected to a connection terminal that is one of an input terminal and an output terminal of an amplifier. A mounting substrate has a ground layer. The matching circuit includes a main line, a sub-line, and an IC chip. The main line is formed of a first conductor pattern intersecting a thickness direction of the mounting substrate, and is connected to a connection terminal of the amplifier. The sub-line is formed of a second conductor pattern intersecting the thickness direction of the mounting substrate, and is connected between the main line and the ground layer. The sub-line is opposed to the main line in the thickness direction of the mounting substrate. The IC chip is disposed on the mounting substrate, and includes an adjustment unit that adjusts impedance conversion characteristics of the matching circuit.

20 Claims, 9 Drawing Sheets

(58) Field of Classification Search
CPC ...... H03H 9/0576; H03H 9/25; H03H 9/0547; H03H 9/0557; H03H 9/6483; H03H 9/70; H03H 7/463; H03H 9/17; H03H 9/72
See application file for complete search history.

(56) References Cited

U.S. PATENT DOCUMENTS

| | | |
|---|---|---|
| 2019/0089323 A1 | 3/2019 | Nosaka |
| 2019/0273528 A1 | 9/2019 | Watanabe |
| 2020/0203291 A1* | 6/2020 | Uejima ................... H01L 25/16 |
| 2021/0005579 A1 | 1/2021 | Matsumoto |
| 2021/0194452 A1 | 6/2021 | Tsukamoto et al. |
| 2021/0226652 A1 | 7/2021 | Matsumoto et al. |
| 2021/0313962 A1* | 10/2021 | Sugaya ................ H03H 9/0523 |
| 2021/0375838 A1* | 12/2021 | Goto ........................ H03F 3/20 |

FOREIGN PATENT DOCUMENTS

| | | |
|---|---|---|
| WO | 2018/116961 A1 | 6/2018 |
| WO | 2019/181590 A1 | 9/2019 |
| WO | 2020/054284 A1 | 3/2020 |
| WO | 2020/090557 A1 | 5/2020 |

* cited by examiner

HIGH-FREQUENCY MODULE AND COMMUNICATION DEVICE

CROSS REFERENCE TO RELATED APPLICATION

This is a continuation of International Application No. PCT/JP2021/015749 filed on Apr. 16, 2021 which claims priority from Japanese Patent Application No. 2020-092377 filed on May 27, 2020. The contents of these applications are incorporated herein by reference in their entireties.

BACKGROUND OF THE DISCLOSURE

Field of the Disclosure

The present disclosure generally relates to a high-frequency module and a communication device, and more particularly, to a high-frequency module including a mounting substrate and a communication device including the high-frequency module.

Description of the Related Art

Patent Document 1 discloses a high-frequency module including a module substrate having a first main surface and a second main surface facing each other, a transmission power amplifier, a transmission output matching circuit, a reception low-noise amplifier, and a reception input matching circuit.

The transmission output matching circuit includes a first inductance element. The first inductance element is mounted on the first main surface of the module substrate.

The reception input matching circuit includes a second inductance element. The second inductance element is mounted on the second main surface of the module substrate.

Patent Document 1: International Publication No. 2019/181590

BRIEF SUMMARY OF THE DISCLOSURE

In a high-frequency module, for example, it is necessary to provide a matching circuit between an amplifier and a plurality of filters in accordance with a frequency band that can be handled by the amplifier, and miniaturization has been desired in some cases.

A possible benefit of the present disclosure is to provide a high-frequency module and a communication device that can be miniaturized.

A high-frequency module according to an aspect of the present disclosure includes a mounting substrate, an amplifier, and a matching circuit. The mounting substrate has a first main surface and a second main surface facing each other. The amplifier is disposed on one main surface of the first main surface and the second main surface of the mounting substrate. The amplifier has an input terminal and an output terminal. The matching circuit is connected to a connection terminal that is one of the input terminal and the output terminal of the amplifier. The mounting substrate includes a ground layer. The matching circuit includes a main line, a sub-line, and an IC chip. The main line is formed of a first conductor pattern intersecting a thickness direction of the mounting substrate. The main line is connected to the connection terminal of the amplifier. The sub-line is formed of a second conductor pattern intersecting the thickness direction. The sub-line is connected between the main line and the ground layer. The sub-line is opposed to the main line in the thickness direction. The IC chip is disposed on the mounting substrate. The IC chip includes an adjustment unit. The adjustment unit adjusts impedance conversion characteristics of the matching circuit.

A high-frequency module according to an aspect of the present disclosure includes a mounting substrate, an amplifier, and a matching circuit. The mounting substrate has a first main surface and a second main surface facing each other. The amplifier is disposed on one main surface of the first main surface and the second main surface of the mounting substrate. The amplifier has an input terminal and an output terminal. The matching circuit is connected to a connection terminal that is one of the input terminal and the output terminal of the amplifier. The mounting substrate includes a ground layer. The matching circuit includes a main line, a sub-line, and an IC chip. The main line is formed of a first conductor pattern intersecting a thickness direction of the mounting substrate. The main line is connected to the connection terminal of the amplifier. The sub-line is formed of a second conductor pattern intersecting the thickness direction. The sub-line is connected between the main line and the ground layer. The sub-line is opposed to the main line in the thickness direction. The IC chip is disposed on the mounting substrate. The main line has a first end connected to the connection terminal of the amplifier and a second end connected to the sub-line. The IC chip includes a first switch and a second switch. The first switch is connected between the first end of the main line and the connection terminal. The second switch is connected between a portion separated from both the first end and the second end in the main line and the connection terminal.

A high-frequency module according to an aspect of the present disclosure includes a mounting substrate, an amplifier, and a matching circuit. The mounting substrate has a first main surface and a second main surface facing each other. The amplifier is disposed on one main surface of the first main surface and the second main surface of the mounting substrate. The amplifier has an input terminal and an output terminal. The matching circuit is connected to a connection terminal that is one of the input terminal and the output terminal of the amplifier. The mounting substrate includes a ground layer. The matching circuit includes a main line, a sub-line, and an IC chip. The main line is formed of a first conductor pattern intersecting a thickness direction of the mounting substrate. The main line is connected to the connection terminal of the amplifier. The sub-line is formed of a second conductor pattern intersecting the thickness direction. The sub-line is connected between the main line and the ground layer. The sub-line is opposed to the main line in the thickness direction. The IC chip is disposed on the mounting substrate. The sub-line has a first end connected to the main line and a second end connected to the ground layer. The IC chip includes a switch. The switch is connected between a portion separated from both the first end and the second end in the sub-line and the ground layer.

A communication device according to an aspect of the present disclosure includes the above high-frequency module and a signal processing circuit. The signal processing circuit is connected to the high-frequency module and performs signal processing on a high-frequency signal.

The high-frequency module and the communication device according to the above-described aspects of the present disclosure can be miniaturized.

DETAILED DESCRIPTION OF THE DISCLOSURE

Figure 1:
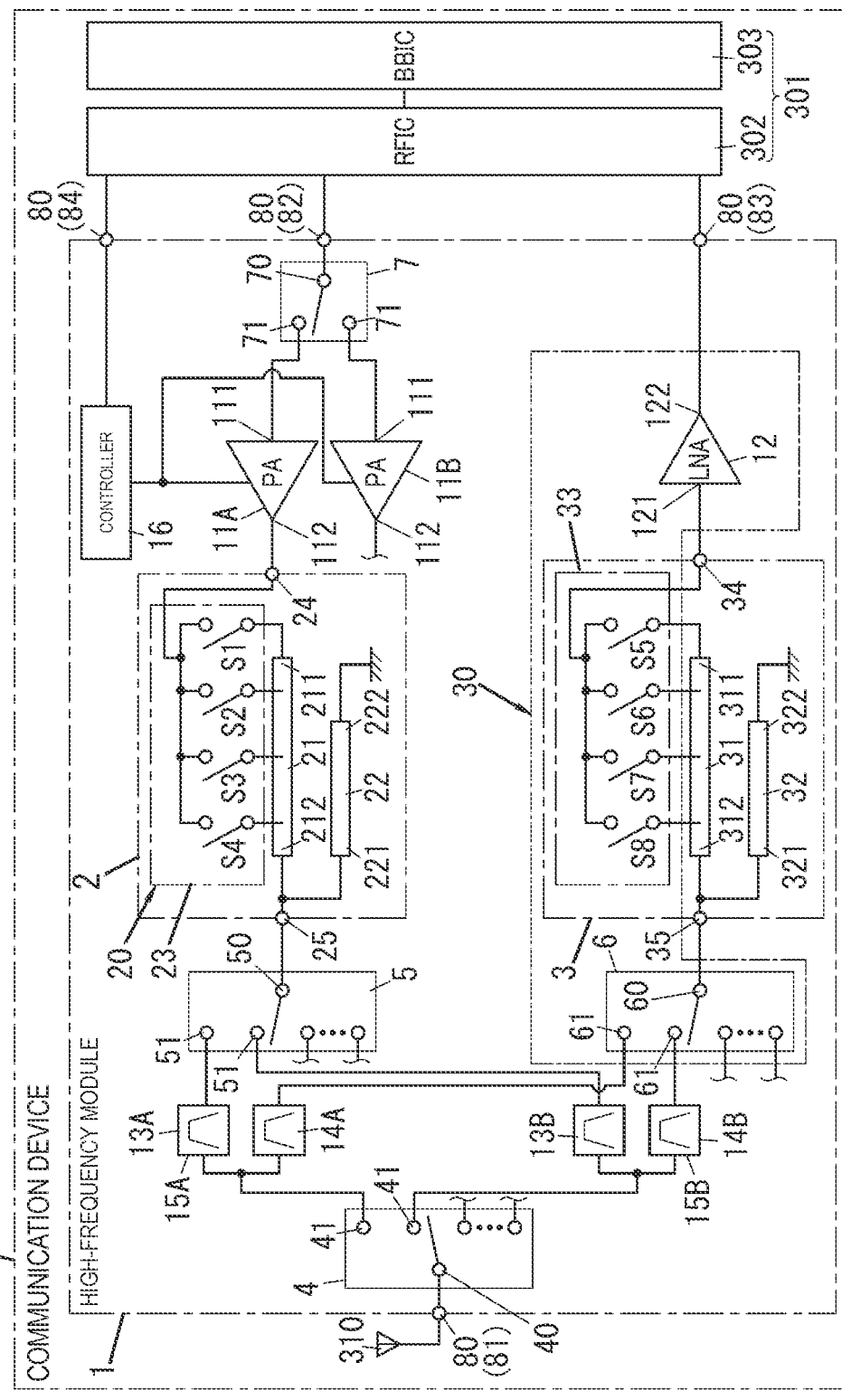
FIG. 1 is a circuit configuration diagram of a communication device including a high-frequency module according to Embodiment 1.

FIGS. 2 to 4, 6, 8, and 9 to be referred to in the following embodiments and the like are schematic views, and ratios of sizes and thicknesses of constituent elements in the drawings do not necessarily reflect actual dimensional ratios.

Embodiment 1

Figure 2:
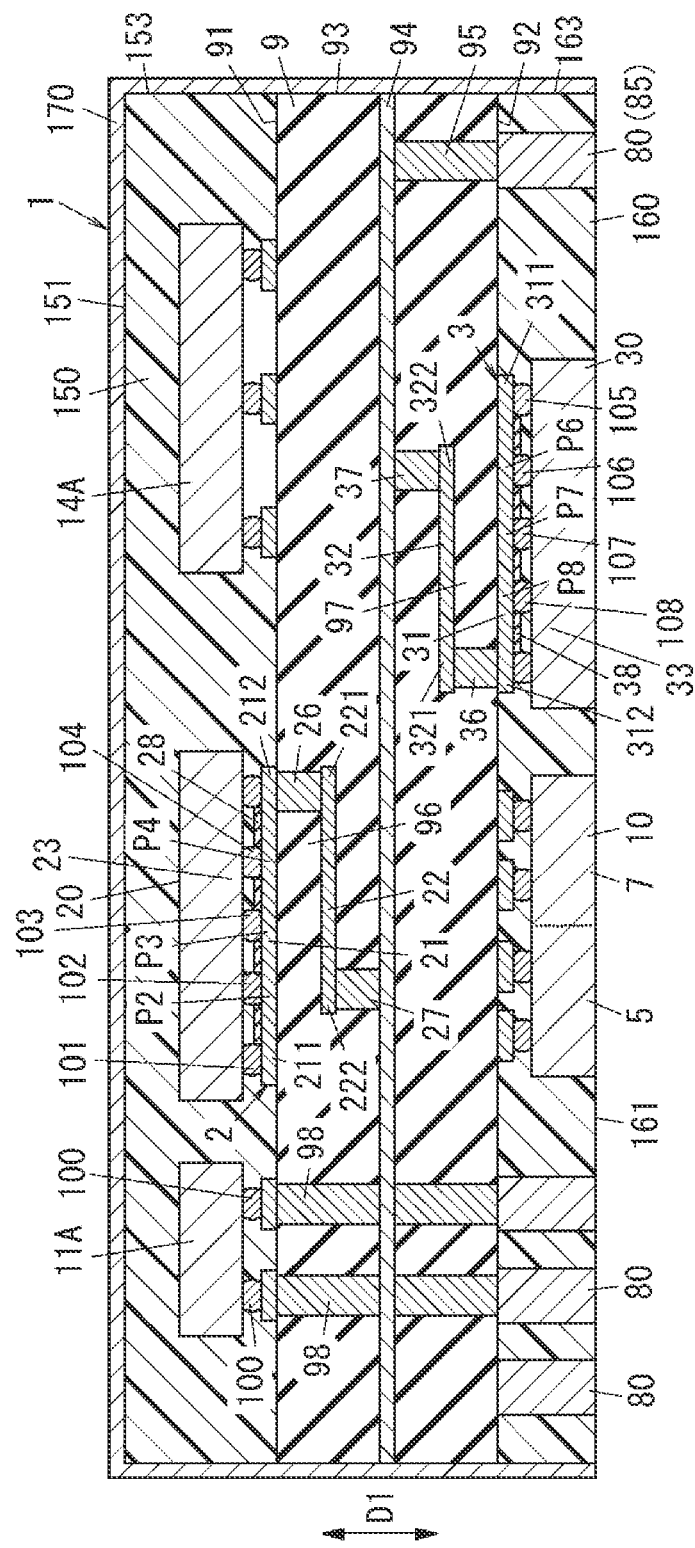
FIG. 2 is a cross-sectional view of the above high-frequency module.

As illustrated in FIG. 2, a high-frequency module 1 according to Embodiment 1 includes a mounting substrate 9. Further, the high-frequency module 1 includes a power amplifier 11A and a low-noise amplifier 12 (see FIG. 1) as the plurality of amplifiers 11A and 12. In addition, the high-frequency module 1 includes an output matching circuit 2 and an input matching circuit 3 as the plurality of matching circuits 2 and 3. The mounting substrate 9 has a first main surface 91 and a second main surface 92 facing each other. The power amplifier 11A is disposed on the first main surface 91 of the mounting substrate 9. The low-noise amplifier 12 is disposed on the second main surface 92 of the mounting substrate 9. The output matching circuit 2 is connected to an output terminal (connection terminal) 112 (see FIG. 1) of the power amplifier 11A. The input matching circuit 3 is connected to an input terminal (connection terminal) 121 (see FIG. 1) of the low-noise amplifier 12. The mounting substrate 9 includes a ground layer 94. The output matching circuit 2 includes a main line 21, a sub-line 22, and an IC chip 20. The main line 21 is connected to the output terminal 112 of the power amplifier 11A. The sub-line 22 is connected between the main line 21 and the ground layer 94. The sub-line 22 is opposed to the main line 21 in a thickness direction D1 of the mounting substrate 9. The IC chip 20 is disposed on the mounting substrate 9. The IC chip 20 includes an adjustment unit 23. The adjustment unit 23 adjusts the impedance conversion characteristics of the output matching circuit 2. The input matching circuit 3 includes a main line 31, a sub-line 32, and an IC chip 30. The main line 31 is formed of a first conductor pattern (first conductor portion) intersecting the thickness direction D1 of the mounting substrate 9. The main line 31 is connected to the input terminal 121 of the low-noise amplifier 12. The sub-line 32 is formed of a second conductor pattern (second conductor portion) intersecting the thickness direction D1 of the mounting substrate 9. The sub-line 32 is connected between the main line 31 and the ground layer 94. The sub-line 32 is opposed to the main line 31 in the thickness direction D1 of the mounting substrate 9. The IC chip 30 is disposed on the mounting substrate 9. The IC chip 30 includes an adjustment unit 33. The adjustment unit 33 adjusts the impedance conversion characteristics of the input matching circuit 3. The high-frequency module 1 according to Embodiment 1 can be miniaturized.

Hereinafter, the high-frequency module 1 and a communication device 300 according to Embodiment 1 will be described in more detail with reference to FIGS. 1 and 2.

(1) High-Frequency Module and Communication Device (1.1) Circuit Configuration of High-Frequency Module and Communication Device The high-frequency module 1 according to Embodiment 1 is used in, for example, the multimode/multiband-compatible communication device 300. The communication device 300 is, for example, a mobile phone (for example, a smartphone), but is not limited thereto, and may be, for example, a wearable terminal (for example, a smartwatch) or the like. The high-frequency module 1 is a module compatible with, for example, the 4G (fourth generation mobile communication) standards, the 5G (fifth generation mobile communication) standards, or the like. The 4G standards are, for example, a 3GPP (Third Generation Partnership Project) LTE (Long Term Evolution) standards. The 5G standards are, for example, 5G NR (New Radio). The high-frequency module 1 is a circuit that can support carrier aggregation and dual connectivity.

For example, the high-frequency module 1 is configured to amplify a transmission signal (high-frequency signal) inputted from a signal processing circuit 301 and output an amplified transmission signal to an antenna 310. Further, the high-frequency module 1 is configured to amplify a reception signal (high-frequency signal) inputted from the antenna 310 and output an amplified reception signal to the signal processing circuit 301. The signal processing circuit 301 is not a constituent element of the high-frequency module 1 but a constituent element of the communication device 300 including the high-frequency module 1. The high-frequency module 1 is controlled by, for example, the signal processing circuit 301 included in the communication device 300. The communication device 300 includes the high-frequency module 1 and the signal processing circuit 301. The communication device 300 further includes the antenna 310. The communication device 300 further includes a circuit board on which the high-frequency module 1 is mounted. The circuit board is, for example, a printed wiring board. The circuit board includes a ground electrode to which a ground potential is applied.

The signal processing circuit 301 includes, for example, an RF signal processing circuit 302 and a baseband signal processing circuit 303. The RF signal processing circuit 302 is, for example, an RFIC (Radio Frequency Integrated Circuit) and performs signal processing on a high-frequency signal. For example, the RF signal processing circuit 302 performs signal processing such as up-conversion on a high-frequency signal (transmission signal) outputted from the baseband signal processing circuit 303, and outputs the high-frequency signal subjected to the signal processing. In addition, for example, the RF signal processing circuit 302 performs signal processing such as down-conversion on a high-frequency signal (reception signal) outputted from the high-frequency module 1, and outputs the high-frequency signal subjected to the signal processing to the baseband signal processing circuit 303. The baseband signal processing circuit 303 is, for example, a BBIC (baseband integrated circuit). The baseband signal processing circuit 303 generates an I-phase signal and a Q-phase signal from the baseband signal. The baseband signal is, for example, an audio signal, an image signal, or the like inputted from outside. The baseband signal processing circuit 303 performs IQ modulation processing by combining the I-phase signal and the Q-phase signal, and outputs a transmission signal. At this time, the transmission signal is generated as a modulated signal (IQ signal) obtained by amplitude-modulating a carrier signal having a predetermined frequency with a period longer than the period of the carrier signal. The reception signal processed by the baseband signal processing circuit 303 is used, for example, as an image signal for image display or as an audio signal for a phone call of a user of the communication device 300. The high-frequency module 1 transmits high-frequency signals (reception signal and transmission signal) between the antenna 310 and the RF signal processing circuit 302 of the signal processing circuit 301.

The high-frequency module 1 includes the power amplifier 11A and the low-noise amplifier 12 as amplifiers. In addition, the high-frequency module 1 includes the output matching circuit 2 as a matching circuit connected to the power amplifier 11A. In addition, the high-frequency module 1 includes the input matching circuit 3 as a matching circuit connected to the low-noise amplifier 12. In addition, the high-frequency module 1 further includes a plurality of (for example, two) transmission filters 13A and 13B and a plurality of (for example, two) reception filters 14A and 14B. In addition, the high-frequency module 1 further includes an antenna switch 4, a band select switch 5, and a band select switch 6. In addition, the high-frequency module 1 further includes a power amplifier 11B and an input-side switch 7. In addition, the high-frequency module 1 further includes a controller 16.

In addition, the high-frequency module 1 includes a plurality of external connection terminals 80. The plurality of external connection terminals 80 includes an antenna terminal 81, a signal input terminal 82, a signal output terminal 83, a control terminal 84, and a plurality of ground terminals 85 (see FIG. 1). The plurality of ground terminals 85 is a terminal to which a ground potential is applied by being electrically connected to the ground electrode of the above-described circuit board included in the communication device 300.

The power amplifier 11A has an input terminal 111 and the output terminal 112. The power amplifier 11A amplifies the transmission signal in a first frequency band inputted to the input terminal 111 and outputs the amplified transmission signal from the output terminal 112. Here, the first frequency band includes, for example, a first communication band and a second communication band. The first communication band corresponds to a transmission signal passing through the transmission filter 13A, and is, for example, Band 11 of the 3GPP LTE standards. The second communication band corresponds to a transmission signal passing through the transmission filter 13B, and is, for example, Band 22 of the 3GPP LTE standards. The input terminal 111 of the power amplifier 11A is connected to the signal input terminal 82. The input terminal 111 of the power amplifier 11A is connected to the signal processing circuit 301 via the signal input terminal 82. The signal input terminal 82 is a terminal for inputting a high-frequency signal (transmission signal) from an external circuit (for example, the signal processing circuit 301) to the high-frequency module 1. The output terminal 112 of the power amplifier 11A is connected to a common terminal 50 of the band select switch 5 via the output matching circuit 2.

The low-noise amplifier 12 has the input terminal 121 and an output terminal 122. The low-noise amplifier 12 amplifies the reception signal in a second frequency band inputted to the input terminal 121 and outputs the amplified reception signal from the output terminal 122. The second frequency band is, for example, the same as the first frequency band, and includes the first communication band and the second communication band. The input terminal 121 of the low-noise amplifier 12 is connected to a common terminal 60 of the band select switch 6 via the input matching circuit 3. The output terminal 122 of the low-noise amplifier 12 is connected to the signal output terminal 83. The output terminal 122 of the low-noise amplifier 12 is connected to the signal processing circuit 301 via, for example, the signal output terminal 83. The signal output terminal 83 is a terminal for outputting a high-frequency signal (reception signal) from the low-noise amplifier 12 to an external circuit (for example, the signal processing circuit 301).

The transmission filter 13A is, for example, a filter having a transmission band of the first communication band as a pass band. The transmission filter 13B is, for example, a filter having a transmission band of the second communication band as a pass band. The reception filter 14A is, for example, a filter having a reception band of the first communication band as a pass band. The reception filter 14B is, for example, a filter having a reception band of the second communication band as a pass band. In the high-frequency module 1 according to Embodiment 1, the transmission filter 13A and the reception filter 14A constitute a duplexer 15A. Further, in the high-frequency module 1 according to Embodiment 1, the transmission filter 13B and the reception filter 14B constitute a duplexer 15B.

The antenna switch 4 has a common terminal 40 and a plurality of selection terminals 41. The common terminal 40 is connected to the antenna terminal 81. The antenna 310 is connected to the antenna terminal 81. In the antenna switch 4, one selection terminal 41 of the plurality of selection terminals 41 is connected to a connection point between an output terminal of the transmission filter 13A and an input terminal of the reception filter 14A, and another selection terminal 41 is connected to a connection point between an output terminal of the transmission filter 13B and an input terminal of the reception filter 14B. The antenna switch 4 is, for example, a switch capable of connecting at least one or more of the plurality of selection terminals 41 to the common terminal 40. Here, the antenna switch 4 is, for example, a switch capable of one-to-one and one-to-many connections.

The antenna switch 4 is controlled by, for example, the signal processing circuit 301. The antenna switch 4 switches the connection state between the common terminal 40 and the plurality of selection terminals 41 in accordance with a control signal from the RF signal processing circuit 302 of the signal processing circuit 301. The antenna switch 4 is, for example, a switch IC (integrated circuit).

The band select switch 5 has the common terminal 50 and a plurality of selection terminals 51. The common terminal 50 is connected to the output terminal 112 of the power amplifier 11A via the output matching circuit 2. In the band select switch 5, one selection terminal 51 of the plurality of selection terminals 51 is connected to an input terminal of the transmission filter 13A, and another selection terminal 51 is connected to an input terminal of the transmission filter 13B. The band select switch 5 is, for example, a switch capable of connecting at least one or more of the plurality of selection terminals 51 to the common terminal 50. Here, the band select switch 5 is, for example, a switch capable of one-to-one and one-to-many connections.

The band select switch 5 is controlled by, for example, the signal processing circuit 301. The band select switch 5 switches the connection state between the common terminal 50 and the plurality of selection terminals 51 in accordance with a control signal from the RF signal processing circuit 302 of the signal processing circuit 301. The band select switch 5 is, for example, a switch IC.

The band select switch 6 has the common terminal 60 and a plurality of selection terminals 61. The common terminal 60 is connected to the input terminal 121 of the low-noise amplifier 12 via the input matching circuit 3. In the band select switch 6, one selection terminal 61 of the plurality of selection terminals 61 is connected to an output terminal of the reception filter 14A, and another selection terminal 61 is connected to an output terminal of the reception filter 14B. The band select switch 6 is, for example, a switch capable of connecting at least one or more of the plurality of selection terminals 61 to the common terminal 60. Here, the band select switch 6 is, for example, a switch capable of one-to-one and one-to-many connections.

The band select switch 6 is controlled by, for example, the signal processing circuit 301. The band select switch 6 switches the connection state between the common terminal 60 and the plurality of selection terminals 61 in accordance with a control signal from the RF signal processing circuit 302 of the signal processing circuit 301. The band select switch 6 is, for example, a switch IC.

The output matching circuit 2 is provided in a signal path between the output terminal 112 of the power amplifier 11A and the common terminal 50 of the band select switch 5. The output matching circuit 2 has a terminal 24 connected to the output terminal 112 of the power amplifier 11A and a terminal 25 connected to the common terminal 50 of the band select switch 5. The output matching circuit 2 is a circuit for impedance matching between the power amplifier 11A and the transmission filters 13A and 13B. The output matching circuit 2 includes the main line 21, the sub-line 22, and the adjustment unit 23.

The main line 21 has a first end 211 connected to the output terminal 112 of the power amplifier 11A and a second end 212 connected to the sub-line 22. The adjustment unit 23 includes a first switch S1 and a plurality of (for example, three) second switches S2 to S4. The first switch S1 is connected between the first end 211 of the main line 21 and the output terminal 112 of the power amplifier 11A. More specifically, the first switch S1 is connected between the first end 211 of the main line 21 and the terminal 24 connected to the output terminal 112 of the power amplifier 11A. The plurality of second switches S2 to S4 is connected between a plurality of (for example, three) portions P2 to P4 (see FIG. 2) separated from both the first end 211 and the second end 212 in the main line 21 and the output terminal 112 of the power amplifier 11A. Here, the plurality of second switches S2 to S4 is connected between the plurality of portions P2 to P4 having line lengths that differ from each other from the second end 212 in the main line 21 and the output terminal 112 of the power amplifier 11A.

The input matching circuit 3 is provided in a signal path between the input terminal 121 of the low-noise amplifier 12 and the common terminal 60 of the band select switch 6. The input matching circuit 3 has a terminal 34 connected to the input terminal 121 of the low-noise amplifier 12 and a terminal 35 connected to the common terminal 60 of the band select switch 6. The input matching circuit 3 is a circuit for impedance matching between the low-noise amplifier 12 and the reception filters 14A and 14B. The input matching circuit 3 includes the main line 31, the sub-line 32, and the adjustment unit 33.

The main line 31 has a first end 311 connected to the input terminal 121 of the low-noise amplifier 12 and a second end 312 connected to the sub-line 32. The adjustment unit 33 includes a first switch S5 and a plurality of (for example, three) second switches S6 to S8. The first switch S5 is connected between the first end 311 of the main line 31 and the input terminal 121 of the low-noise amplifier 12. More specifically, the first switch S5 is connected between the first end 311 of the main line 31 and the terminal 34 connected to the input terminal 121 of the low-noise amplifier 12. The plurality of second switches S6 to S8 is connected between a plurality of (for example, three) portions P6 to P8 (see FIG. 2) separated from both the first end 311 and the second end 312 in the main line 31 and the input terminal 121 of the low-noise amplifier 12. Here, the plurality of second switches S6 to S8 is connected between the plurality of portions P6 to P8 having line lengths that differ from each other from the second end 312 in the main line 31 and the input terminal 121 of the low-noise amplifier 12.

The input-side switch 7 includes a common terminal 70 and a plurality of selection terminals 71. The common terminal 70 is connected to the signal input terminal 82. In the input-side switch 7, one selection terminal 71 of the plurality of selection terminals 71 is connected to the input terminal 111 of the power amplifier 11A, and another selection terminal 71 is connected to the input terminal 111 of the power amplifier 11B. The output terminal 112 of the power amplifier 11B is connected to the antenna switch 4 via at least a matching circuit different from the matching circuit 2 and a transmission filter, for example. The input-side switch 7 is, for example, a switch capable of connecting at least one or more of the plurality of selection terminals 71 to the common terminal 70. Here, the input-side switch 7 is, for example, a switch capable of one-to-one and one-to-many connections.

The input-side switch 7 is controlled by, for example, the signal processing circuit 301. The input-side switch 7 switches the connection state between the common terminal 70 and the plurality of selection terminals 71 in accordance with a control signal from the RF signal processing circuit 302 of the signal processing circuit 301. The input-side switch 7 is, for example, a switch IC.

The controller 16 is connected to the power amplifier 11A and the power amplifier 11B. In addition, the controller 16 is connected to the control terminal 84. The controller 16 is connected to the signal processing circuit 301 via the control terminal 84. The control terminal 84 is a terminal for inputting a control signal from an external circuit (for example, the signal processing circuit 301) to the high-frequency module 1. The controller 16 controls the power amplifier 11A and the power amplifier 11B based on a control signal from the signal processing circuit 301. The controller 16 also controls the power amplifier 11B based on a control signal from the signal processing circuit 301.

(1.2) Structure of High-Frequency Module

Hereinafter, the structure of the high-frequency module 1 will be described with reference to FIGS. 1 and 2.

As illustrated in FIG. 2, the high-frequency module 1 includes the mounting substrate 9, the power amplifier 11A, the low-noise amplifier 12 (see FIG. 1), the output matching circuit 2, and the input matching circuit 3. In addition, the high-frequency module 1 also includes the plurality of external connection terminals 80. In addition, as illustrated in FIG. 1, the high-frequency module 1 further includes the plurality of transmission filters 13A and 13B and the two reception filters 14A and 14B. In addition, the high-frequency module 1 further includes the controller 16. In addition, the high-frequency module 1 further includes the antenna switch 4, the band select switch 5, the band select switch 6, and the input-side switch 7.

As illustrated in FIG. 2, the mounting substrate 9 has the first main surface 91 and the second main surface 92 facing each other in the thickness direction D1 of the mounting substrate 9. The mounting substrate 9 is, for example, a multilayer substrate including a plurality of dielectric layers and a plurality of conductive layers. The plurality of dielectric layers and the plurality of conductive layers are laminated in the thickness direction D1 of the mounting substrate 9. The plurality of conductive layers is formed in a predetermined pattern determined for each layer. Each of the plurality of conductive layers includes one or a plurality of conductor portions in a plane orthogonal to the thickness direction D1 of the mounting substrate 9. The material of each conductive layer is, for example, copper. The plurality of conductive layers includes the ground layer 94. In the high-frequency module 1, the plurality of ground terminals 85 and the ground layer 94 are electrically connected to each other through a via conductor 95 and the like included in the mounting substrate 9. The mounting substrate 9 is, for example, an LTCC (Low Temperature Co-fired Ceramics) substrate. The mounting substrate 9 is not limited to the LTCC substrate and may be, for example, a printed wiring board, an HTCC (High Temperature Co-fired Ceramics) substrate, or a resin multilayer substrate.

Further, the mounting substrate 9 is not limited to the LTCC substrate and may be, for example, a wiring structure. The wiring structure is, for example, a multilayer structure. The multilayer structure includes at least one insulating layer and at least one conductive layer. The insulating layer is formed in a predetermined pattern. When there is a plurality of insulating layers, the plurality of insulating layers is formed in a predetermined pattern determined for each layer. The conductive layer is formed in a predetermined pattern different from the predetermined pattern of the insulating layer. When there is a plurality of conductive layers, the plurality of conductive layers is formed in a predetermined pattern determined for each layer. The conductive layer may include one or more redistribution portions. In the wiring structure, of two surfaces (a first surface and a second surface) facing each other in the thickness direction of the multilayer structure, the first surface is the first main surface 91 of the mounting substrate 9, and the second surface is the second main surface 92 of the mounting substrate 9.

The first main surface 91 and the second main surface 92 of the mounting substrate 9 are separated from each other in the thickness direction D1 of the mounting substrate 9, and intersect the thickness direction D1 of the mounting substrate 9. The first main surface 91 of the mounting substrate 9 is orthogonal to the thickness direction D1 of the mounting substrate 9, for example, but may include such as a side surface of a conductor portion as a surface that is not orthogonal to the thickness direction D1, for example. In addition, the second main surface 92 of the mounting substrate 9 is orthogonal to the thickness direction D1 of the mounting substrate 9, for example, but may include such as a side surface of a conductor portion as a surface that is not orthogonal to the thickness direction D1, for example. Further, the first main surface 91 and the second main surface 92 of the mounting substrate 9 may have fine irregularities, concave portions, or convex portions.

The power amplifier 11A has a function of amplifying a transmission signal inputted to the input terminal 111 of the power amplifier 11A and outputs the amplified transmission signal from the output terminal 112. The power amplifier 11A is, for example, a GaAs-based IC chip including an HBT (Heterojunction Bipolar Transistor) as an amplifying element, but is not limited thereto, and may be, for example, a Si-based IC chip, a SiGe-based IC chip, or a GaN-based IC chip. For example, when the power amplifier 11A is a Si-based IC chip, the amplifying element may be a bipolar transistor or may be a MOSFET. In a plan view from the thickness direction D1 of the mounting substrate 9, the outer peripheral shape of the power amplifier 11A is a quadrangular shape.

In the high-frequency module 1 according to Embodiment 1, the power amplifier 11A is mounted on the first main surface 91 of the mounting substrate 9. Here, "being mounted" includes that the power amplifier 11A is disposed on (mechanically connected to) the first main surface 91 of the mounting substrate 9 and that the power amplifier 11A is electrically connected to (an appropriate conductor portion of) the mounting substrate 9. Therefore, in the high-frequency module 1, the power amplifier 11A is disposed on the first main surface 91 of the mounting substrate 9. Here, the power amplifier 11A and the first main surface 91 of the mounting substrate 9 are connected by a plurality of bumps 100. In short, the power amplifier 11A is flip-chip mounted on the first main surface 91 of the mounting substrate 9.

The power amplifier 11B (see FIG. 1) has a function of amplifying a transmission signal inputted to the input terminal 111 of the power amplifier 11B and outputs the amplified transmission signal from the output terminal 112. Similar to the power amplifier 11A, the power amplifier 11B is a GaAs-based IC chip, but is not limited thereto, and may be, for example, a Si-based IC chip, a SiGe-based IC chip, or a GaN-based IC chip. The frequency band that can be handled by the power amplifier 11B is different from the frequency band that can be handled by the power amplifier 11A, but may partially overlap or may be the same. The power amplifier 11B is mounted on the first main surface 91 of the mounting substrate 9. Therefore, the power amplifier 11B is disposed on the first main surface 91 of the mounting substrate 9.

Each of the plurality of transmission filters 13A and 13B (see FIG. 1) is, for example, a bare chip acoustic wave filter. In a plan view from the thickness direction D1 of the mounting substrate 9, the outer peripheral shape of each of the plurality of transmission filters 13A and 13B is a quadrangular shape. The acoustic wave filter is, for example, a ladder filter, and includes a plurality of (for example, four) series arm resonators and a plurality of (for example, three) parallel arm resonators. In the acoustic wave filter, each of the plurality of series arm resonators and the plurality of parallel arm resonators includes an acoustic wave resonator. The acoustic wave filter is, for example, a surface acoustic wave filter using a surface acoustic wave. In the surface acoustic wave filter, each of the plurality of series arm resonators and the plurality of parallel arm resonators is, for example, a SAW (surface acoustic wave) resonator including an IDT (interdigital transducer) electrode. Each of the plurality of transmission filters 13A and 13B is mounted on the first main surface 91 of the mounting substrate 9 such that a space is formed between each of the IDT electrodes and the first main surface 91 of the mounting substrate 9. Each of the plurality of transmission filters 13A and 13B is not limited to a bare chip acoustic wave filter, and may be an acoustic wave filter having a package structure.

The main line 21 of the output matching circuit 2 is formed of the first conductor pattern intersecting (for example, orthogonal to) the thickness direction D1 of the mounting substrate 9. The main line 21 is disposed on the first main surface 91 of the mounting substrate 9 on which the power amplifier 11A is disposed. The sub-line 22 of the output matching circuit 2 is formed of a second pattern intersecting (for example, orthogonal to) the thickness direction D1 of the mounting substrate 9. The sub-line 22 is disposed between the first main surface 91 and the second main surface 92 of the mounting substrate 9 so as to be separated from the first main surface 91 and the second main surface 92. The material of the main line 21 and the sub-line 22 is the same as that of the conductor portion of the mounting substrate 9. As described above, the main line 21 has the first end 211 and the second end 212. In addition, the sub-line 22 has a first end 221 and a second end 222. The second end 212 of the main line 21 and the first end 221 of the sub-line 22 overlap each other when viewed from the thickness direction D1 of the mounting substrate 9, and are connected to each other by a via conductor 26 interposed between the second end 212 of the main line 21 and the first end 221 of the sub-line 22. The second end 222 of the sub-line 22 is connected to the ground layer 94 through a via conductor 27. The ground layer 94 is disposed between the first main surface 91 and the second main surface 92 of the mounting substrate 9 so as to be separated from the first main surface 91 and the second main surface 92. In the thickness direction D1 of the mounting substrate 9, the distance between the ground layer 94 and the first main surface 91 is longer than the distance between the sub-line 22 and the first main surface 91. The ground layer 94 overlaps a part of the first main surface 91 in a plan view from the thickness direction D1 of the mounting substrate 9. The shape of the ground layer 94 in a plan view from the thickness direction D1 of the mounting substrate 9 is determined so as not to be in contact with a wiring portion that is not connected to the ground layer 94 among a plurality of wiring portions between the first main surface 91 and the second main surface 92 of the mounting substrate 9. The main line 21, the sub-line 22, and the via conductor 26 are formed integrally with the mounting substrate 9.

Figure 3:
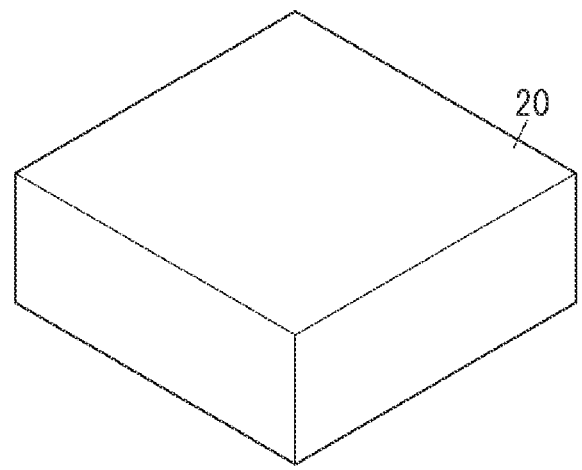
FIG. 3 is an exploded perspective view of a main part for explaining a modification of a main line and a sub-line in the above high-frequency module.
Figure 3:
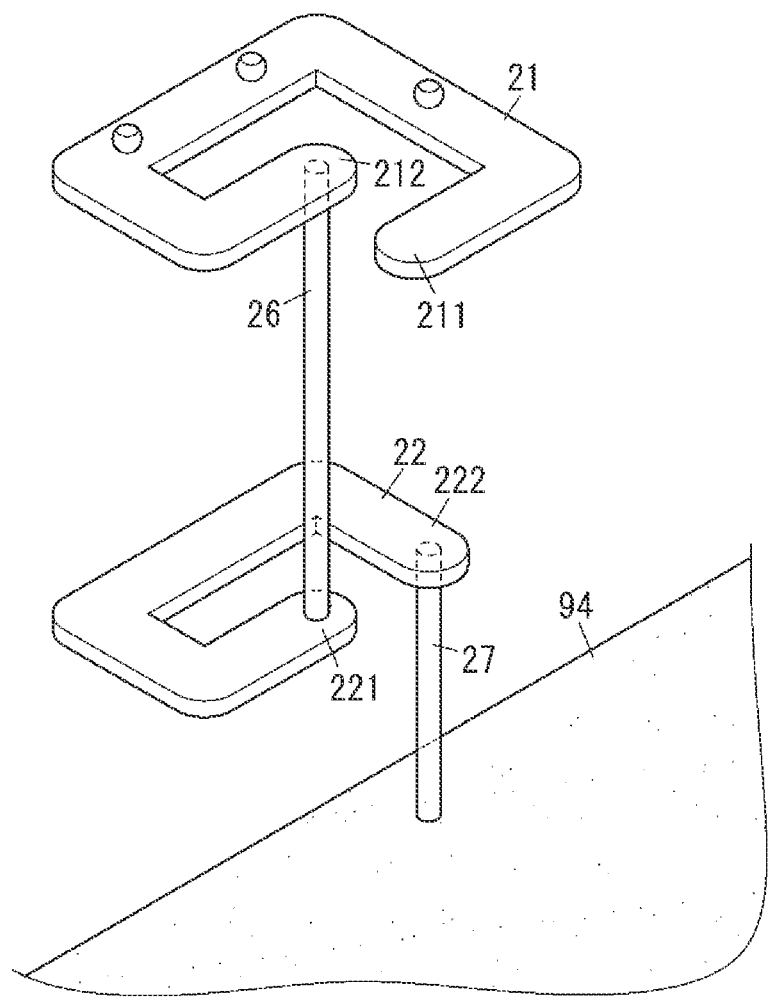

Each of the main line 21 and the sub-line 22 has a linear shape (band shape) when viewed from the thickness direction D1 of the mounting substrate 9. The line width of the main line 21 (in the example of FIG. 2, the width in the direction orthogonal to the paper surface) and the line width of the sub-line 22 (in the example of FIG. 2, the width in the direction orthogonal to the paper surface) are the same, but may be different. The main line 21 and the sub-line 22 are opposed to each other in the thickness direction D1 of the mounting substrate 9. Here, in the high-frequency module 1, the main line 21 and the sub-line 22 overlap each other in a plan view from the thickness direction D1 of the mounting substrate 9. In the example of FIG. 2, a part of the main line 21 overlaps the entire sub-line 22, but the present disclosure is not limited thereto, and a part of the main line 21 may overlap only a part of the sub-line 22. A dielectric portion 96, which is a part of the mounting substrate 9, is interposed between the main line 21 and the sub-line 22 in the thickness direction D1 of the mounting substrate 9. The dielectric portion 96 includes, for example, a part of one or more dielectric layers among the plurality of dielectric layers of the mounting substrate 9. The line length of the sub-line 22 is shorter than the line length of the main line 21, but is not limited thereto, and may be the same as the line length of the main line 21, for example. In this case, in the high-frequency module 1, the entire main line 21 may overlap the entire sub-line 22 in a plan view from the thickness direction D1 of the mounting substrate 9. The shape of the main line 21 is not limited to a linear shape, and may be, for example, a spiral shape as illustrated in FIG. 3. In this case, the sub-line 22 has a shape overlapping a part of the main line 21 in a plan view from the thickness direction D1 of the mounting substrate 9. In the case where the main line 21 has a spiral shape, the inductance value of the main line 21 can be increased and a higher Q value can be easily obtained as compared with the case where the main line 21 has a linear shape.

The IC chip 20 including the adjustment unit 23 is, for example, a Si-based IC chip. In a plan view from the thickness direction D1 of the mounting substrate 9, the outer peripheral shape of the IC chip 20 is a quadrangular shape. Each of the first switch S1 and the plurality of second switches S2 to S4 in the adjustment unit 23 is, for example, an FET (Field Effect Transistor), but is not limited thereto, and may be, for example, a bipolar transistor.

The IC chip 20 is mounted on the first main surface 91 of the mounting substrate 9. Therefore, the IC chip 20 is disposed on the first main surface 91 of the mounting substrate 9. The IC chip 20 overlaps the main line 21 and the sub-line 22 in a plan view from the thickness direction D1 of the mounting substrate 9.

In the IC chip 20, the first switch S1 (see FIG. 1) of the adjustment unit 23 is connected to the first end 211 of the main line 21 via a bump 101. In addition, in the IC chip 20, the plurality of second switches S2 to S4 (see FIG. 1) of the adjustment unit 23 is connected to the plurality of portions P2 to P4 having line lengths that differ from each other from the second end 212 in the main line 21 by a plurality of bumps 102 to 104. The adjustment unit 23 is controlled by, for example, the signal processing circuit 301 (see FIG. 1) so that one switch of the four switches including the first switch S1 and the three second switches S2 to S4 is turned on and the remaining three switches are turned off. In the output matching circuit 2, depending on which one of the first switch S1, the second switch S2, the second switch S3, and the second switch S4 is in the ON state, the states of magnetic coupling between the main line 21 and the sub-line 22 differ, and the impedance conversion characteristics differ, and therefore, the impedance at the terminal 25 on the side opposite to the terminal 24 side in the output matching circuit 2 differs. Therefore, in the high-frequency module 1, the input impedance of the transmission filters 13A and 13B connected to the output matching circuit 2 can be adjusted.

The bumps 101 to 104 are, for example, solder bumps. When solder bumps are employed as the bumps 101 to 104, the high-frequency module 1 preferably further includes a resist layer 28 having a predetermined pattern on the main line 21. The resist layer 28 has a predetermined pattern determined so as to expose each of the first end 211, the second end 212, and the plurality of portions P2 to P4 of the main line 21. The resist layer 28 has electrical insulation properties. The resist layer 28 has solder wettability lower than that of the main line 21. The resist layer 28 is, for example, a solder resist. As such, in the high-frequency module 1, when the IC chip 20 is mounted on the mounting substrate 9, it is possible to suppress the solder from spreading out on the main line 21.

The bumps 101 to 104 are not limited to solder bumps, and may be gold bumps or copper bumps, for example.

In the high-frequency module 1 according to Embodiment 1, the IC chip 30 includes the adjustment unit 33, the low-noise amplifier 12 (see FIG. 1), and the band select switch 6 (see FIG. 1). The IC chip 30 is, for example, a Si-based IC chip. In a plan view from the thickness direction D1 of the mounting substrate 9, the outer peripheral shape of the IC chip 30 is a quadrangular shape.

Each of the first switch S5 and the plurality of second switches S6 to S8 of the adjustment unit 33 in the IC chip 30 is, for example, an FET, but is not limited thereto, and may be, for example, a bipolar transistor. The low-noise amplifier 12 has a function of amplifying a reception signal inputted to the input terminal 121 of the low-noise amplifier 12 and outputting the amplified reception signal from the output terminal 122. The low-noise amplifier 12 includes, for example, an FET as an amplifying element. The amplifying element is not limited to the FET, and may be, for example, a bipolar transistor. The band select switch 6 is a switch IC and includes, for example, a plurality of FETs.

In the high-frequency module 1 according to Embodiment 1, the IC chip 30 including the low-noise amplifier 12 is mounted on the second main surface 92 of the mounting substrate 9. Here, "being mounted" includes that the IC chip 30 is disposed on (mechanically connected to) the second main surface 92 of the mounting substrate 9 and that the IC chip 30 is electrically connected to (an appropriate conductor portion of) the mounting substrate 9. Therefore, in the high-frequency module 1, the IC chip 30 is disposed on the second main surface 92 of the mounting substrate 9, and the low-noise amplifier 12 is disposed on the second main surface 92 of the mounting substrate 9.

Each of the plurality of reception filters 14A and 14B (see FIG. 1) is, for example, a bare chip acoustic wave filter. In a plan view from the thickness direction D1 of the mounting substrate 9, the outer peripheral shape of each of the plurality of reception filters 14A and 14B is a quadrangular shape. The acoustic wave filter is, for example, a ladder filter, and includes a plurality of (for example, four) series arm resonators and a plurality of (for example, three) parallel arm resonators. In the acoustic wave filter, each of the plurality of series arm resonators and the plurality of parallel arm resonators includes an acoustic wave resonator. The acoustic wave filter is, for example, a surface acoustic wave filter using a surface acoustic wave. In the surface acoustic wave filter, each of the plurality of series arm resonators and the plurality of parallel arm resonators is, for example, a SAW resonator including an IDT electrode. Each of the plurality of reception filters 14A and 14B is mounted on the first main surface 91 of the mounting substrate 9 such that a space is formed between each of the IDT electrodes and the first main surface 91 of the mounting substrate 9. Each of the plurality of reception filters 14A and 14B is not limited to a bare chip acoustic wave filter and may be an acoustic wave filter having a package structure.

The main line 31 of the input matching circuit 3 is formed of the first conductor pattern intersecting (for example, orthogonal to) the thickness direction D1 of the mounting substrate 9. The main line 31 is disposed on the second main surface 92 of the mounting substrate 9 on which the low-noise amplifier 12 is disposed. The sub-line 32 of the input matching circuit 3 is formed of the second conductor pattern intersecting (for example, orthogonal to) the thickness direction D1 of the mounting substrate 9. The sub-line 32 is disposed between the first main surface 91 and the second main surface 92 of the mounting substrate 9 so as to be separated from the first main surface 91 and the second main surface 92. The material of the main line 31 and the sub-line 32 is the same as that of the conductor portion of the mounting substrate 9. As described above, the main line 31 has the first end 311 and the second end 312. In addition, the sub-line 32 has a first end 321 and a second end 322. The second end 312 of the main line 31 and the first end 321 of the sub-line 32 overlap each other when viewed from the thickness direction D1 of the mounting substrate 9, and are connected to each other by a via conductor 36 interposed between the second end 312 of the main line 31 and the first end 321 of the sub-line 32. The second end 322 of the sub-line 32 is connected to the ground layer 94 through a via conductor 37. In the thickness direction D1 of the mounting substrate 9, the distance between the ground layer 94 and the second main surface 92 is longer than the distance between the sub-line 32 and the second main surface 92. The ground layer 94 overlaps a part of the second main surface 92 in a plan view from the thickness direction D1 of the mounting substrate 9. The main line 31, the sub-line 32, and the via conductor 36 are formed integrally with the mounting substrate 9.

Each of the main line 31 and the sub-line 32 has a linear shape (band shape) when viewed from the thickness direction D1 of the mounting substrate 9. The line width of the main line 31 (in the example of FIG. 2, the width in the direction orthogonal to the paper surface) and the line width of the sub-line 32 (in the example of FIG. 2, the width in the direction orthogonal to the paper surface) are the same, but may be different. The main line 31 and the sub-line 32 are opposed to each other in the thickness direction D1 of the mounting substrate 9. Here, in the high-frequency module 1, the main line 31 and the sub-line 32 overlap each other in a plan view from the thickness direction D1 of the mounting substrate 9. In the example of FIG. 2, a part of the main line 31 overlaps the entire sub-line 32, but the present disclosure is not limited thereto, and a part of the main line 31 may overlap only a part of the sub-line 32. A dielectric portion 97, which is a part of the mounting substrate 9, is interposed between the main line 31 and the sub-line 32 in the thickness direction D1 of the mounting substrate 9. The dielectric portion 97 includes, for example, a part of one or more dielectric layers among the plurality of dielectric layers of the mounting substrate 9. The line length of the sub-line 32 is shorter than the line length of the main line 31, but is not limited thereto, and may be the same as the line length of the main line 31, for example. In this case, in the high-frequency module 1, the entire main line 31 may overlap the entire sub-line 32 in a plan view from the thickness direction D1 of the mounting substrate 9. The shape of the main line 31 is not limited to a linear shape and may be, for example, a spiral shape. In this case, the sub-line 32 has a shape overlapping a part of the main line 31 in a plan view from the thickness direction D1 of the mounting substrate 9.

The IC chip 30 including the adjustment unit 33 overlaps the main line 31 and the sub-line 32 in a plan view from the thickness direction D1 of the mounting substrate 9.

In the IC chip 30, the first switch S5 (see FIG. 1) of the adjustment unit 33 is connected to the first end 311 of the main line 31 via a bump 105. In addition, in the IC chip 30, the plurality of second switches S6 to S8 (see FIG. 1) of the adjustment unit 33 is connected to the plurality of portions P6 to P8 having line lengths that differ from each other from the second end 312 in the main line 31 by a plurality of bumps 106 to 108. The adjustment unit 33 is controlled by, for example, the signal processing circuit 301 (see FIG. 1) so that one switch of the four switches including the first switch S5 and the three second switches S6 to S8 is turned on and the remaining three switches are turned off. In the input matching circuit 3, depending on which one of the first switch S5, the second switch S6, the second switch S7, and the second switch S8 is in the ON state, the states of magnetic coupling between the main line 31 and the sub-line 32 differ, and the impedance conversion characteristics differ, and therefore, the impedance at the terminal 35 on the side opposite to the terminal 34 side in the input matching circuit 3 differs. Therefore, in the high-frequency module 1, the input impedance of the reception filters 14A and 14B connected to the input matching circuit 3 can be adjusted.

The bumps 105 to 108 are, for example, solder bumps. When solder bumps are employed as the bumps 105 to 108, the high-frequency module 1 preferably further includes a resist layer 38 having a predetermined pattern on the main line 31. The resist layer 38 has a predetermined pattern determined so as to expose each of the first end 311, the second end 312, and the plurality of portions P6 to P8 of the main line 31. The resist layer 38 has electrical insulation properties. The resist layer 38 has solder wettability lower than that of the main line 31. The resist layer 38 is, for example, a solder resist. As such, in the high-frequency module 1, when the IC chip 30 is mounted on the mounting substrate 9, it is possible to suppress the solder from spreading out on the main line 31.

The bumps 105 to 108 are not limited to solder bumps, and may be gold bumps or copper bumps, for example.

In the high-frequency module 1, the antenna switch 4 (see FIG. 1), the band select switch 5, and the input-side switch 7 are mounted on the second main surface 92 of the mounting substrate 9. Therefore, the antenna switch 4, the band select switch 5, and the input-side switch 7 are disposed on the second main surface 92 of the mounting substrate 9. In the high-frequency module 1, the band select switch 5 and the input-side switch 7 are included in one IC chip 10. The IC chip 10 is a Si-based IC chip. In a plan view from the thickness direction D1 of the mounting substrate 9, the outer peripheral shape of the IC chip 10 is a quadrangular shape. The IC chip 10 may further include the antenna switch 4. The band select switch 5 and the input-side switch 7 may be included in the IC chip 20.

The plurality of external connection terminals 80 is disposed on the second main surface 92 of the mounting substrate 9. The material of the plurality of external connection terminals 80 is, for example, metal (for example, copper, copper alloy, or the like).

The plurality of external connection terminals 80 includes the plurality of ground terminals 85 in addition to the antenna terminal 81, the signal input terminal 82, the signal output terminal 83, and the control terminal 84 described above. The plurality of ground terminals 85 is connected to the ground layer 94 of the mounting substrate 9 through the via conductor 95 as described above. The ground layer 94 is a circuit ground of the high-frequency module 1.

In addition, in the high-frequency module 1 according to Embodiment 1, each of the plurality of external connection terminals 80 is a columnar electrode. Here, the columnar electrode is, for example, a cylindrical electrode.

In addition, in the high-frequency module 1 according to Embodiment 1, the mounting substrate 9 includes a plurality of via conductors 98. The plurality of via conductors 98 is connected to the power amplifier 11A, and overlaps the power amplifier 11A in the thickness direction D1 of the mounting substrate 9. In the high-frequency module 1, the power amplifier 11A and the IC chip 20 do not overlap each other in a plan view from the thickness direction D1 of the mounting substrate 9. In addition, in the high-frequency module 1, there is no circuit component that is disposed on the second main surface 92 of the mounting substrate 9 and overlaps the power amplifier 11A in a plan view from the thickness direction D1 of the mounting substrate 9.

In addition, the high-frequency module 1 further includes a first resin layer 150. The first resin layer 150 covers at least a part of each of the plurality of electronic components (the power amplifier 11A, the IC chip 20, the transmission filters 13A, 13B, the reception filters 14A, 14B, and the like) disposed on the first main surface 91 of the mounting substrate 9 on the first main surface 91 side of the mounting substrate 9. The first resin layer 150 contains resin (for example, an epoxy resin). The first resin layer 150 may contain a filler in addition to the resin.

In addition, the high-frequency module 1 further includes a second resin layer 160. The second resin layer 160 covers at least a part of each of the plurality of electronic components (the IC chip 30, the antenna switch 4, the band select switch 5, the input-side switch 7, the controller 16, and the like) disposed on the second main surface 92 of the mounting substrate 9 on the second main surface 92 side of the mounting substrate 9. The second resin layer 160 contains resin (for example, an epoxy resin). The second resin layer 160 may contain a filler in addition to the resin. The material of the second resin layer 160 may be the same as or different from that of the first resin layer 150. The second resin layer 160 is formed so as to expose the surface of each of the IC chip 30, the band select switch 5, and the input-side switch 7 on the side opposite to the mounting substrate 9 side, but is not limited thereto and may cover the surface. The second resin layer 160 has a main surface 161 on the side opposite to the mounting substrate 9 side. The main surface 161 of the second resin layer 160 is substantially flush with the surface of each of the IC chip 30, the band select switch 5, and the input-side switch 7 on the side opposite to the mounting substrate 9 side, but is not limited thereto.

In addition, the high-frequency module 1 further includes a shield layer 170. The shield layer 170 has conductivity. The material of the shield layer 170 includes, for example, one or more kinds of metals. The material of the shield layer 170 includes, for example, silver. The shield layer 170 covers a main surface 151 of the first resin layer 150 on the side opposite to the mounting substrate 9 side, an outer peripheral surface 153 of the first resin layer 150, an outer peripheral surface 93 of the mounting substrate 9, and an outer peripheral surface 163 of the second resin layer 160. The shield layer 170 is in contact with at least a part of the outer peripheral surface of the ground layer 94 of the mounting substrate 9. Thus, the potential of the shield layer 170 can be made equal to the potential of the ground layer.

(2) Summary (2.1) High-Frequency Module

The high-frequency module 1 according to Embodiment 1 includes the mounting substrate 9, the power amplifier 11A (amplifier), and the output matching circuit 2 (matching circuit). The mounting substrate 9 has the first main surface 91 and the second main surface 92 facing each other. The power amplifier 11A is disposed on the first main surface 91 of the mounting substrate 9. The power amplifier 11A has the input terminal 111 and the output terminal 112. The output matching circuit 2 is connected to the output terminal 112 (connection terminal) of the power amplifier 11A. The mounting substrate 9 includes the ground layer 94. The output matching circuit 2 includes the main line 21, the sub-line 22, and the IC chip 20. The main line 21 is formed of the first conductor pattern intersecting the thickness direction D1 of the mounting substrate 9. The main line 21 is connected to the output terminal 112 of the power amplifier 11A. The sub-line 22 is formed of the second conductor pattern intersecting the thickness direction D1 of the mounting substrate 9. The sub-line 22 is connected between the main line 21 and the ground layer 94. The sub-line 22 is opposed to the main line 21 in the thickness direction D1 of the mounting substrate 9. The IC chip 20 is disposed on the mounting substrate 9. The IC chip 20 includes the adjustment unit 23. The adjustment unit 23 adjusts the impedance conversion characteristics of the output matching circuit 2.

The high-frequency module 1 according to Embodiment 1 can be miniaturized. In the high-frequency module 1 according to Embodiment 1, since the output matching circuit 2 includes the main line 21 and the sub-line 22, it is possible to cope with a wider frequency band, and thus it is possible to achieve miniaturization. In addition, in the high-frequency module 1 according to Embodiment 1, since the output matching circuit 2 includes the IC chip 20 including the adjustment unit 23, the impedance conversion characteristics of the output matching circuit 2 can be adjusted, and thus it is possible to achieve miniaturization.

In addition, the high-frequency module 1 according to Embodiment 1 includes the mounting substrate 9, the power amplifier 11A (amplifier), and the output matching circuit 2 (matching circuit). The mounting substrate 9 has the first main surface 91 and the second main surface 92 facing each other. The power amplifier 11A is disposed on the first main surface 91 of the mounting substrate 9. The power amplifier 11A has the input terminal 111 and the output terminal 112. The output matching circuit 2 is connected to the output terminal 112 (connection terminal) of the power amplifier 11A. The mounting substrate 9 includes the ground layer 94. The output matching circuit 2 includes the main line 21, the sub-line 22, and the IC chip 20. The main line 21 is formed of the first conductor pattern intersecting the thickness direction D1 of the mounting substrate 9. The main line 21 is connected to the output terminal 112 of the power amplifier 11A. The sub-line 22 is formed of the second conductor pattern intersecting the thickness direction D1 of the mounting substrate 9. The sub-line 22 is connected between the main line 21 and the ground layer 94. The sub-line 22 is opposed to the main line 21 in the thickness direction D1 of the mounting substrate 9. The IC chip 20 is disposed on the mounting substrate 9. The main line 21 has the first end 211 connected to the output terminal 112 of the power amplifier 11A and the second end 212 connected to the sub-line 22. The IC chip 20 includes the first switch S1 and the second switches S2 to S4. The first switch S1 is connected between the first end 211 of the main line 21 and the output terminal 112 of the power amplifier 11A. The second switches S2 to S4 are connected between the portions P2 to P4 separated from both the first end 211 and the second end 212 in the main line 21 and the output terminal 112 of the power amplifier 11A.

The high-frequency module 1 according to Embodiment 1 can be miniaturized. In the high-frequency module 1 according to Embodiment 1, since the output matching circuit 2 includes the main line 21 and the sub-line 22, it is possible to cope with a wider frequency band, and thus it is possible to achieve miniaturization. In addition, in the high-frequency module 1 according to Embodiment 1, since the output matching circuit 2 includes the IC chip 20 including the first switch S1 and the second switches S2 to S4, the impedance conversion characteristics of the output matching circuit 2 can be adjusted, and thus it is possible to achieve miniaturization.

In addition, the high-frequency module 1 according to Embodiment 1 includes the mounting substrate 9, the low-noise amplifier 12 (amplifier), and the input matching circuit 3 (matching circuit). The mounting substrate 9 has the first main surface 91 and the second main surface 92 facing each other. The low-noise amplifier 12 is disposed on the second main surface 92 of the mounting substrate 9. The low-noise amplifier 12 has the input terminal 121 and the output terminal 122. The input matching circuit 3 is connected to the input terminal 121 (connection terminal) of the low-noise amplifier 12. The mounting substrate 9 includes the ground layer 94. The input matching circuit 3 includes the main line 31, the sub-line 32, and the IC chip 30. The main line 31 is formed of the first conductor pattern intersecting the thickness direction D1 of the mounting substrate 9. The main line 31 is connected to the input terminal 121 of the low-noise amplifier 12. The sub-line 32 is formed of the second conductor pattern intersecting the thickness direction D1 of the mounting substrate 9. The sub-line 32 is connected between the main line 31 and the ground layer 94. The sub-line 32 is opposed to the main line 31 in the thickness direction D1 of the mounting substrate 9. The IC chip 30 is disposed on the mounting substrate 9. The IC chip 30 includes the adjustment unit 33. The adjustment unit 33 adjusts the impedance conversion characteristics of the input matching circuit 3.

The high-frequency module 1 according to Embodiment 1 can be miniaturized. In the high-frequency module 1 according to Embodiment 1, since the input matching circuit 3 includes the main line 31 and the sub-line 32, it is possible to cope with a wider frequency band, and thus it is possible to achieve miniaturization. In addition, in the high-frequency module 1 according to Embodiment 1, since the input matching circuit 3 includes the IC chip 30 including the adjustment unit 33, the impedance conversion characteristics of the input matching circuit 3 can be adjusted, and thus it is possible to achieve miniaturization.

In addition, the high-frequency module 1 according to Embodiment 1 includes the mounting substrate 9, the low-noise amplifier 12 (amplifier), and the input matching circuit 3 (matching circuit). The mounting substrate 9 has the first main surface 91 and the second main surface 92 facing each other. The low-noise amplifier 12 is disposed on the second main surface 92 of the mounting substrate 9. The low-noise amplifier 12 has the input terminal 121 and the output terminal 122. The input matching circuit 3 is connected to the input terminal 121 (connection terminal) of the low-noise amplifier 12. The mounting substrate 9 includes the ground layer 94. The input matching circuit 3 includes the main line 31, the sub-line 32, and the IC chip 30. The main line 31 is formed of the first conductor pattern intersecting the thickness direction D1 of the mounting substrate 9. The main line 31 is connected to the input terminal 121 of the low-noise amplifier 12. The sub-line 32 is formed of the second conductor pattern intersecting the thickness direction D1 of the mounting substrate 9. The sub-line 32 is connected between the main line 31 and the ground layer 94. The sub-line 32 is opposed to the main line 31 in the thickness direction D1 of the mounting substrate 9. The IC chip 30 is disposed on the mounting substrate 9. The main line 31 has the first end 311 connected to the input terminal 121 of the low-noise amplifier 12 and the second end 312 connected to the sub-line 32. The IC chip 30 includes the first switch S5 and the second switches S6 to S8. The first switch S5 is connected between the first end 311 of the main line 31 and the input terminal 121 of the low-noise amplifier 12. The second switches S6 to S8 are connected between portions P6 to P8 separated from both the first end 311 and the second end 312 in the main line 31 and the input terminal 121 of the low-noise amplifier 12.

The high-frequency module 1 according to Embodiment 1 can be miniaturized. In the high-frequency module 1 according to Embodiment 1, since the input matching circuit 3 includes the main line 31 and the sub-line 32, it is possible to cope with a wider frequency band, and thus it is possible to achieve miniaturization. In addition, in the high-frequency module 1 according to Embodiment 1, since the input matching circuit 3 includes the IC chip 30 including the first switch S5 and the second switches S6 to S8, the impedance conversion characteristics of the input matching circuit 3 can be adjusted, and thus it is possible to achieve miniaturization.

(2.2) Communication Device

The communication device 300 according to Embodiment 1 includes the signal processing circuit 301 and the high-frequency module 1. The signal processing circuit 301 is connected to the high-frequency module 1 and performs signal processing on a high-frequency signal.

Since the communication device 300 according to Embodiment 1 includes the high-frequency module 1, it is possible to achieve miniaturization.

The plurality of electronic components constituting the signal processing circuit 301 may be mounted on, for example, the above-described circuit board, or may be mounted on a circuit board (second circuit board) different from the circuit board (first circuit board) on which the high-frequency module 1 is mounted.

(3) Modification

Figure 4:
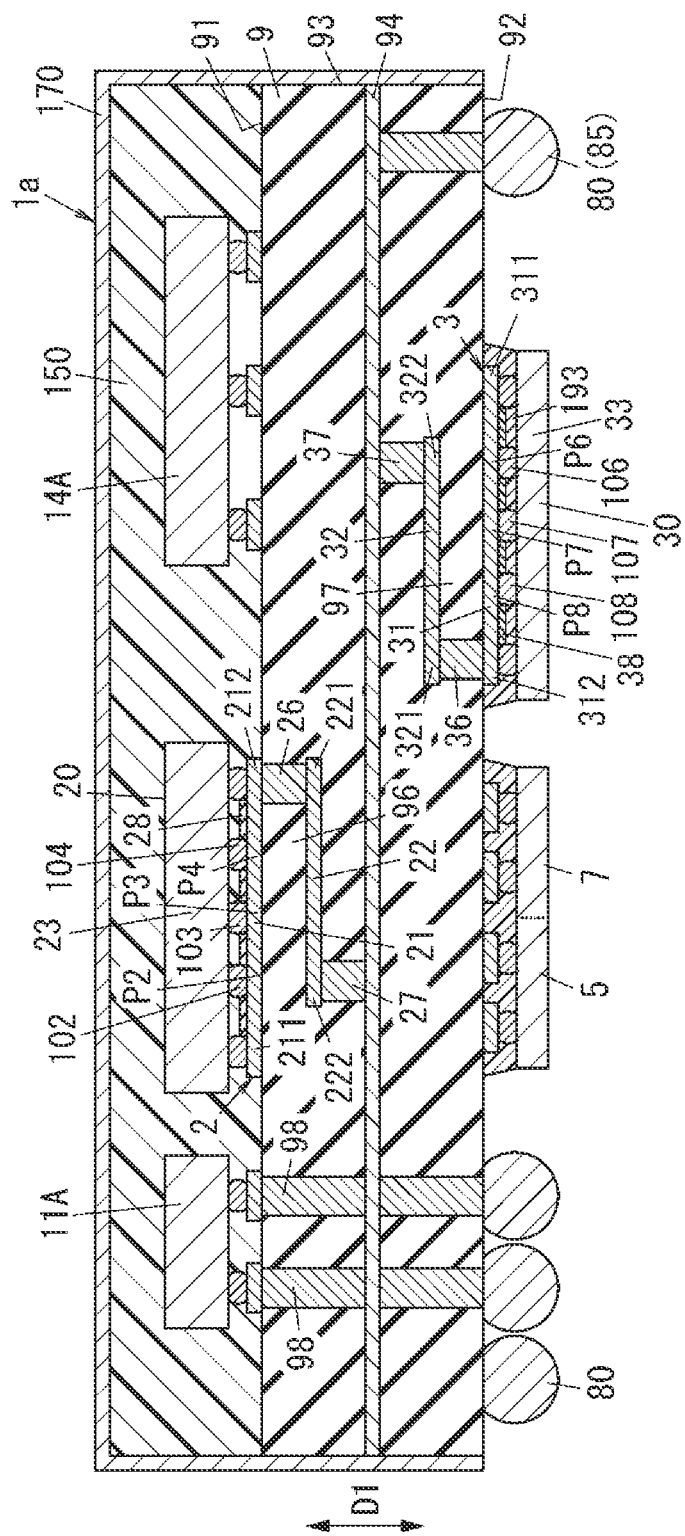
FIG. 4 is a cross-sectional view of a high-frequency module according to a modification of Embodiment 1.

A high-frequency module 1a according to a modification of Embodiment 1 will be described with reference to FIG. 4. Regarding the high-frequency module 1a according to the modification, the same constituent elements as those of the high-frequency module 1 according to Embodiment 1 are denoted by the same reference signs, and description thereof will be omitted.

The high-frequency module 1a according to the modification is different from the high-frequency module 1 according to Embodiment 1 in that the plurality of external connection terminals 80 is a ball bump. Further, the high-frequency module 1a according to the modification is different from the high-frequency module 1 according to Embodiment 1 in that the high-frequency module 1a does not include the second resin layer 160 of the high-frequency module 1 according to Embodiment 1.

The high-frequency module 1a according to the modification includes an underfill portion 193 provided in a gap between the IC chip 30 disposed on the second main surface 92 of the mounting substrate 9 and the second main surface 92 of the mounting substrate 9.

The material of the ball bump constituting each of the plurality of external connection terminals 80 is, for example, gold, copper, solder, or the like.

The plurality of external connection terminals 80 may be a mixture of the external connection terminals 80 constituted by ball bumps and the external connection terminals 80 constituted by columnar electrodes.

Embodiment 2

Figure 5:
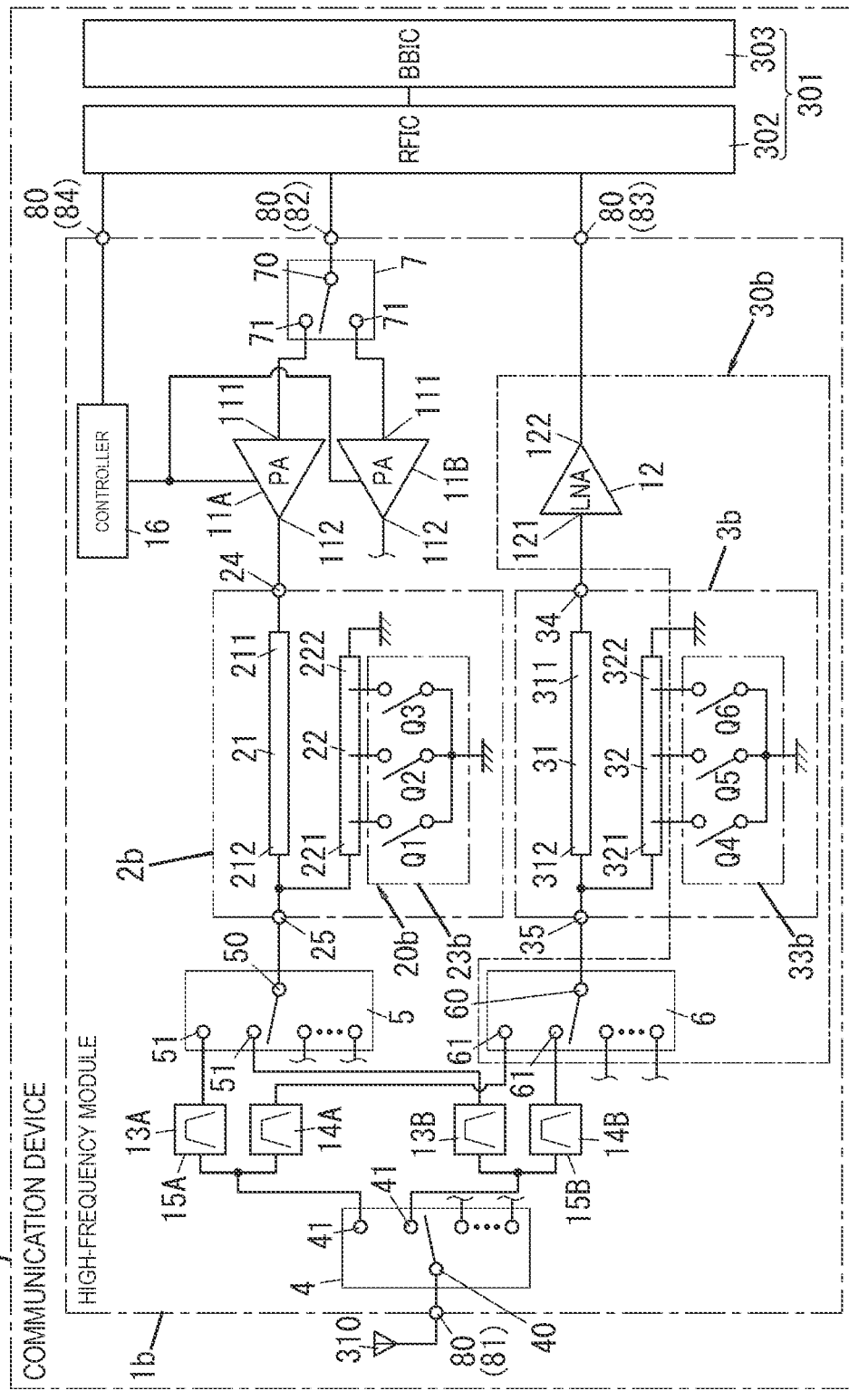
FIG. 5 is a circuit configuration diagram of a communication device including a high-frequency module according to Embodiment 2.
Figure 6:
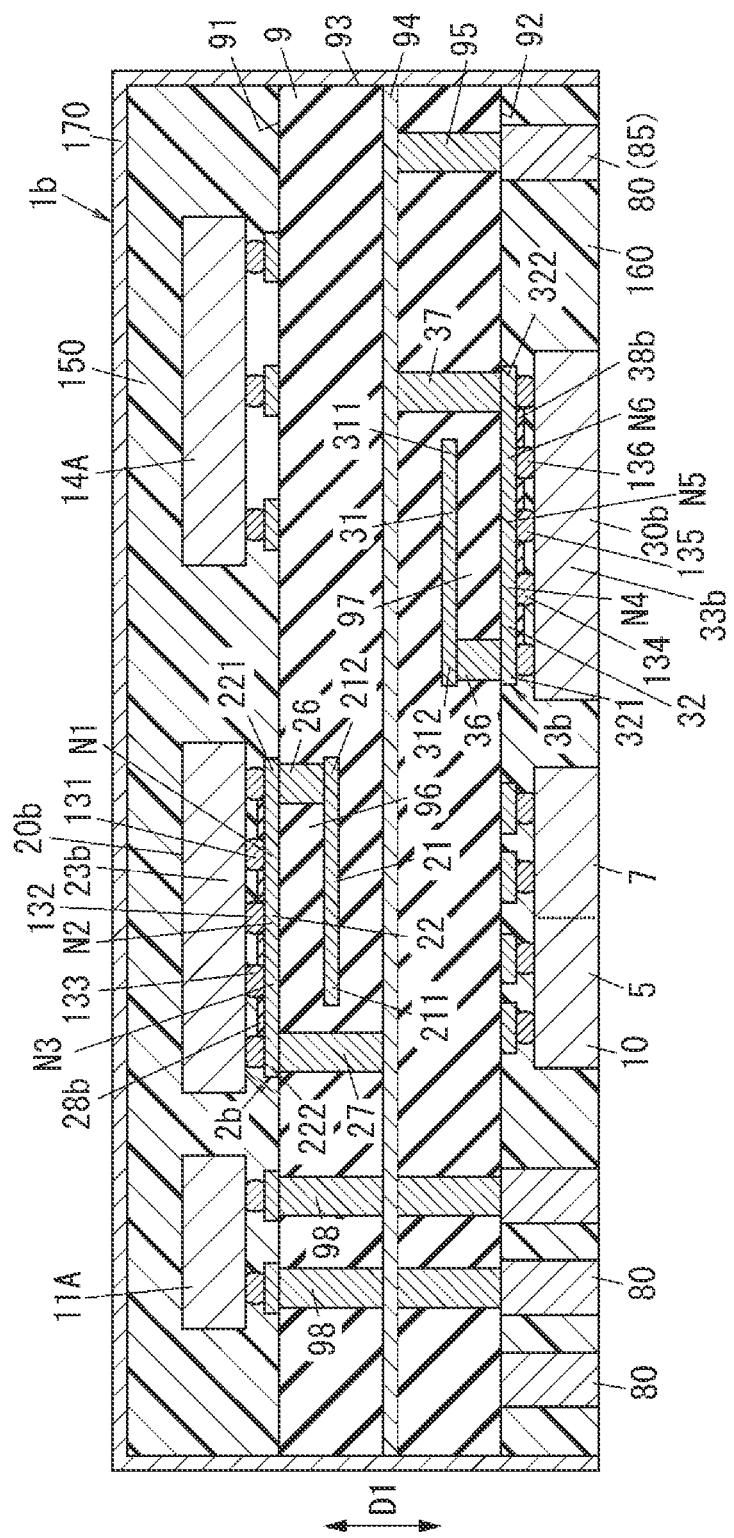
FIG. 6 is a cross-sectional view of the above high-frequency module.

A high-frequency module 1b and the communication device 300 according to Embodiment 2 will be described with reference to FIGS. 5 and 6. Regarding the high-frequency module 1b and the communication device 300 according to Embodiment 2, the same constituent elements as those of the high-frequency module 1 and the communication device 300 according to Embodiment 1 are denoted by the same reference signs, and description thereof will be omitted.

The high-frequency module 1b according to Embodiment 2 is different from the high-frequency module 1 according to Embodiment 1 in that the high-frequency module 1b includes an output matching circuit 2b instead of the output matching circuit 2 of the high-frequency module 1 according to Embodiment 1. In addition, the high-frequency module 1b according to Embodiment 2 is different from the high-frequency module 1 according to Embodiment 1 in that the high-frequency module 1b includes an input matching circuit 3b instead of the input matching circuit 3 of the high-frequency module 1 according to Embodiment 1.

The output-matching circuit 2b includes an adjustment unit 23b instead of the adjustment unit 23 of the output matching circuit 2. In the high-frequency module 1b, the first end 211 of the main line 21 of the output matching circuit 2b is connected to the terminal 24. The adjustment unit 23b includes a plurality of (for example, three) switches Q1, Q2, and Q3 connected between a plurality of (for example, three) portions N1, N2, and N3 (see FIG. 6) separated from both the first end 221 and the second end 222 in the sub-line 22 and the ground layer 94 (see FIG. 6). The plurality of switches Q1, Q2, and Q3 is connected between the ground layer 94 and the plurality of portions N1, N2, and N3 having respective different line lengths from the first end 221 in the sub-line 22. The output matching circuit 2b includes an IC chip 20b instead of the IC chip 20 of the output matching circuit 2. The IC chip 20b includes the adjustment unit 23b.

In the IC chip 20b, the plurality of switches Q1 to Q3 of the adjustment unit 23b is connected to the plurality of portions N1 to N3 having respective different line lengths from the first end 221 in the sub-line 22 by a plurality of bumps 131 to 133. The adjustment unit 23b is controlled by, for example, the signal processing circuit 301 so that one switch of the three switches Q1 to Q3 is turned on and the remaining two switches are turned off. In the output matching circuit 2b, depending on which one of the plurality of switches Q1 to Q3 is in the ON state, the states of magnetic coupling between the main line 21 and the sub-line 22 differ, and the impedance conversion characteristics differ, and therefore, the impedance at the terminal 25 on the side opposite to the terminal 24 side in the output matching circuit 2b differs. Therefore, in the high-frequency module 1, the input impedance of the transmission filters 13A and 13B connected to the output matching circuit 2b can be adjusted.

The bumps 131 to 133 are, for example, solder bumps. When solder bumps are employed as the bumps 131 to 133, the high-frequency module 1b preferably further includes a resist layer 28b having a predetermined pattern on the sub-line 22. The resist layer 28b has a predetermined pattern determined so as to expose each of the plurality of portions N1 to N3 of the sub-line 22. The resist layer 28b has an electrical insulating property. The resist layer 28b has solder wettability lower than that of the sub-line 22. The resist layer 28b is, for example, a solder resist. As such, in the high-frequency module 1b, when the IC chip 20b is mounted on the mounting substrate 9, it is possible to suppress the solder from spreading out on the sub-line 22.

The bumps 131 to 133 are not limited to solder bumps, and may be gold bumps or copper bumps, for example.

The input matching circuit 3b includes an adjustment unit 33b instead of the adjustment unit 33 of the input matching circuit 3 in the high-frequency module 1 according to Embodiment 1. In the high-frequency module 1b, the first end 311 of the main line 31 of the input matching circuit 3b is connected to the input terminal 121 of the low-noise amplifier 12. The adjustment unit 33b includes a plurality of (for example, three) switches Q4, Q5, and Q6 connected between a plurality of (for example, three) portions N5, N5, and N6 (see FIG. 6) separated from both the first end 321 and the second end 322 in the sub-line 32 and the ground layer 94 (see FIG. 6). The plurality of switches Q4, Q5, and Q6 is connected between the ground layer 94 and the plurality of portions N4, N5, and N6 having respective different line lengths from the first end 321 in the sub-line 32. The input matching circuit 3b includes an IC chip 30b instead of the IC chip 30 of the input matching circuit 3. The IC chip 30b includes the adjustment unit 33b instead of the adjustment unit 33 of the IC chip 30.

In the IC chip 30b, the plurality of switches Q4 to Q6 of the adjustment unit 33b is connected to the plurality of portions N4 to N6 having respective different line lengths from the first end 321 in the sub-line 32 by a plurality of bumps 134 to 136. The adjustment unit 33b is controlled by, for example, the signal processing circuit 301 so that one switch of the three switches Q4 to Q6 is turned on and the remaining two switches are turned off. In the input matching circuit 3b, depending on which one of the plurality of switches Q4 to Q6 is in the ON state, the states of magnetic coupling between the main line 31 and the sub-line 32 differ, and the impedance conversion characteristics differ, and therefore, the impedance at the terminal 25 on the side opposite to the terminal 34 side in the input matching circuit 3b differs. Therefore, in the high-frequency module 1b, the input impedance of the reception filters 14A and 14B connected to the input matching circuit 3b can be adjusted.

The bumps 134 to 136 are, for example, solder bumps. When solder bumps are employed as the bumps 134 to 136, the high-frequency module 1b preferably further includes a resist layer 38b having a predetermined pattern on the sub-line 32. The resist layer 38b has a predetermined pattern determined so as to expose each of the plurality of portions N4 to N6 of the sub-line 32. The resist layer 38b has an electrical insulating property. The resist layer 38b has solder wettability lower than that of the sub-line 32. The resist layer 38b is, for example, a solder resist. As such, in the high-frequency module 1b, when the IC chip 30b is mounted on the mounting substrate 9, it is possible to suppress the solder from spreading out on the sub-line 32.

The bumps 134 to 136 are not limited to solder bumps, and may be gold bumps or copper bumps, for example.

The high-frequency module 1b according to Embodiment 2 can be miniaturized as in the high-frequency module 1 according to Embodiment 1.

In the high-frequency module 1b according to Embodiment 2, since the output matching circuit 2b includes the main line 21 and the sub-line 22, it is possible to cope with a wider frequency band, and thus it is possible to achieve miniaturization. In addition, in the high-frequency module 1b according to Embodiment 2, since the output matching circuit 2b includes the IC chip 20b including the adjustment unit 23b, the impedance conversion characteristics of the output matching circuit 2b can be adjusted, and thus it is possible to achieve miniaturization.

The high-frequency module 1b according to Embodiment 2 includes the mounting substrate 9, the power amplifier 11A (amplifier), and the output matching circuit 2b (matching circuit). The mounting substrate 9 has the first main surface 91 and the second main surface 92 facing each other. The power amplifier 11A is disposed on the first main surface 91 of the mounting substrate 9. The power amplifier 11A has the input terminal 111 and the output terminal 112. The output matching circuit 2b is connected to the output terminal 112 (connection terminal) of the power amplifier 11A. The mounting substrate 9 includes the ground layer 94. The output matching circuit 2b includes the main line 21, the sub-line 22, and the IC chip 20b. The main line 21 is formed of the first conductor pattern intersecting the thickness direction D1 of the mounting substrate 9. The main line 21 is connected to the output terminal 112 of the power amplifier 11A. The sub-line 22 is formed of the second conductor pattern intersecting the thickness direction D1 of the mounting substrate 9. The sub-line 22 is connected between the main line 21 and the ground layer 94. The sub-line 22 is opposed to the main line 21 in the thickness direction D1 of the mounting substrate 9. The IC chip 20b is disposed on the mounting substrate 9. The sub-line 22 has the first end 221 connected to the main line 21 and the second end 222 connected to the ground layer 94. The IC chip 20b includes the switches Q1 to Q3. The switches Q1 to Q3 are connected between the portions N1 to N3 separated from both the first end 221 and the second end 222 in the sub-line 22 and the ground layer 94.

The high-frequency module 1b according to Embodiment 2 can be miniaturized. Since the output matching circuit 2b includes the main line 21 and the sub-line 22, it is possible to cope with a wider frequency band, and thus it is possible to achieve miniaturization. In addition, in the high-frequency module 1b according to Embodiment 2, since the output matching circuit 2b includes the IC chip 20b including the switches Q1 to Q3, the impedance conversion characteristics of the output matching circuit 2b can be adjusted, and thus it is possible to achieve miniaturization.

In the high-frequency module 1b according to Embodiment 2, since the input matching circuit 3b includes the main line 31 and the sub-line 32, it is possible to cope with a wider frequency band, and thus it is possible to achieve miniaturization. In addition, in the high-frequency module 1b according to Embodiment 2, since the input matching circuit 3b includes the IC chip 30b including the adjustment unit 33b, the impedance conversion characteristics of the input matching circuit 3b can be adjusted, and thus it is possible to achieve miniaturization.

The high-frequency module 1 according to Embodiment 2 includes the mounting substrate 9, the low-noise amplifier 12 (amplifier), and the input matching circuit 3b (matching circuit). The mounting substrate 9 has the first main surface 91 and the second main surface 92 facing each other. The low-noise amplifier 12 is disposed on the second main surface 92 of the mounting substrate 9. The low-noise amplifier 12 has the input terminal 121 and the output terminal 122. The input matching circuit 3b is connected to input terminal 121 (connection terminals) of the low-noise amplifier 12. The mounting substrate 9 includes the ground layer 94. The input matching circuit 3b includes the main line 31, the sub-line 32, and the IC chip 30b. The main line 31 is formed of the first conductor pattern intersecting the thickness direction D1 of the mounting substrate 9. The main line 31 is connected to the input terminal 121 of the low-noise amplifier 12. The sub-line 32 is formed of the second conductor pattern intersecting the thickness direction D1 of the mounting substrate 9. The sub-line 32 is connected between the main line 31 and the ground layer 94. The sub-line 32 is opposed to the main line 31 in the thickness direction D1 of the mounting substrate 9. The IC chip 30b is disposed on the mounting substrate 9. The sub-line 32 has the first end 321 connected to the main line 31 and the second end 322 connected to the ground layer 94. The IC chip 30b includes the switches Q4 to Q6. The switches Q4 to Q6 are connected between the portions N4 to N6 separated from both the first end 321 and the second end 322 in the sub-line 32 and the ground layer 94.

In the high-frequency module 1b according to Embodiment 2, since the input matching circuit 3b includes the main line 31 and the sub-line 32, it is possible to cope with a wider frequency band, and thus it is possible to achieve miniaturization. In addition, in the high-frequency module 1b according to Embodiment 2, since the input matching circuit 3b includes the IC chip 30b including the switches Q4 to Q6, the impedance conversion characteristics of the input matching circuit 3b can be adjusted, and thus, it is possible to achieve miniaturization.

In addition, since the communication device 300 according to Embodiment 2 includes the high-frequency module 1b and the signal processing circuit 301, it is possible to achieve miniaturization.

Embodiment 3

Figure 7:
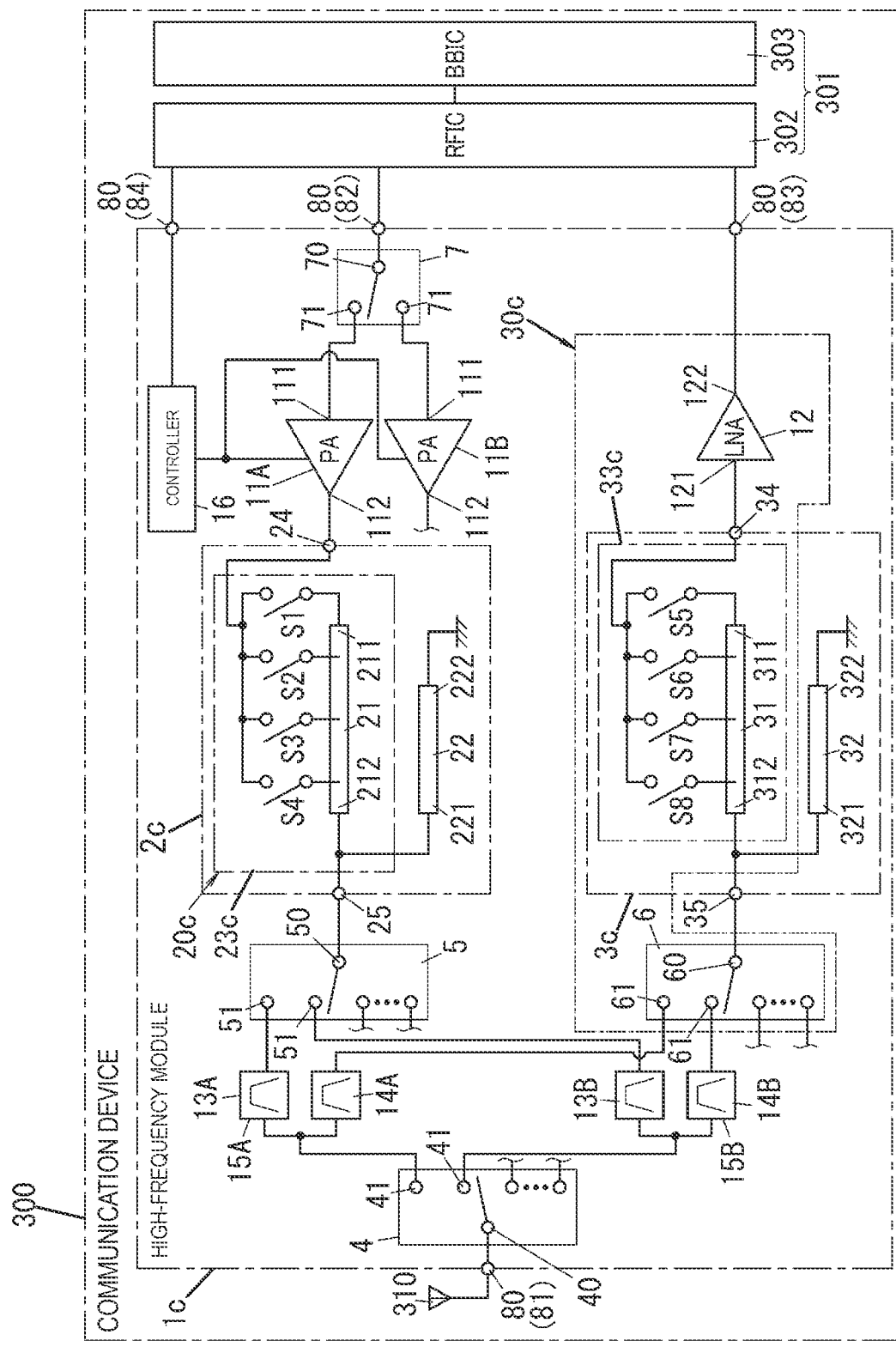
FIG. 7 is a circuit configuration diagram of a communication device including a high-frequency module according to Embodiment 3.
Figure 8:
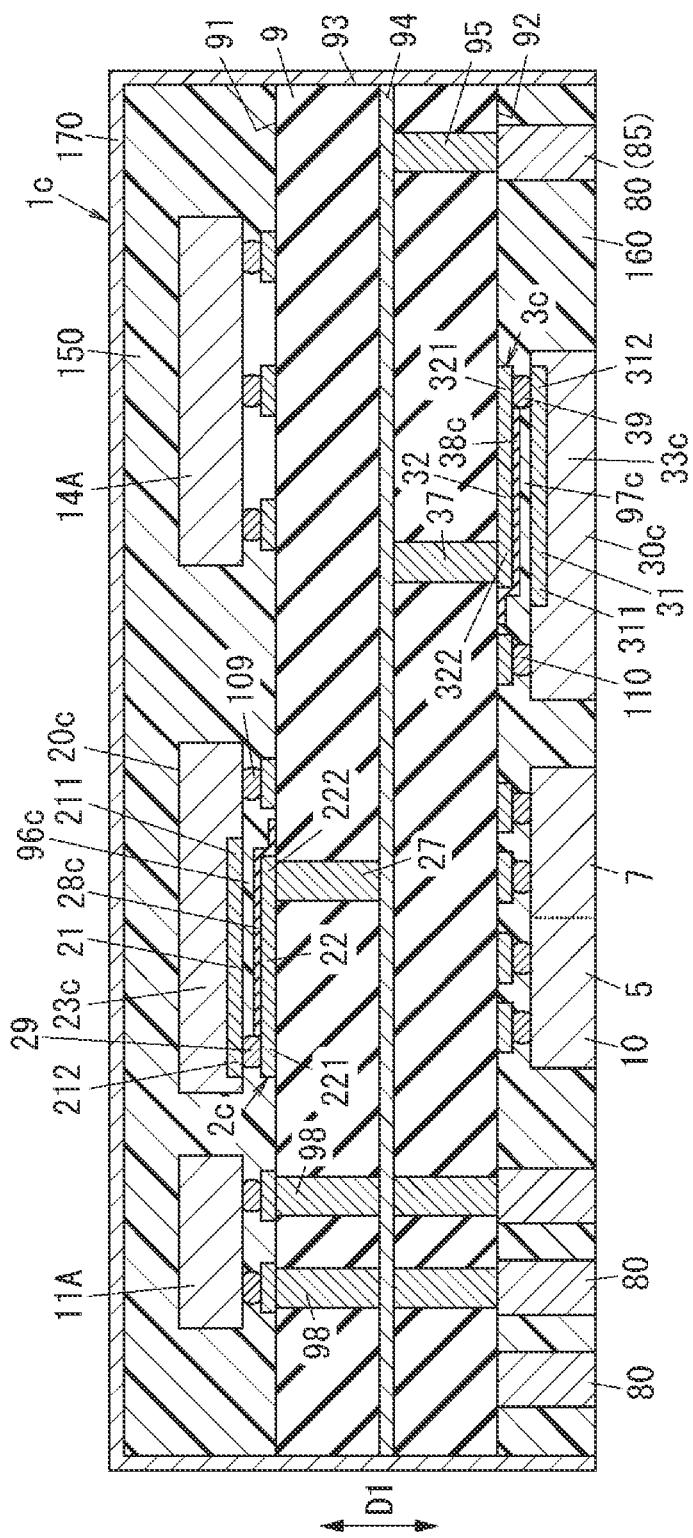
FIG. 8 is a cross-sectional view of the above high-frequency module.

A high-frequency module 1c and the communication device 300 according to Embodiment 3 will be described with reference to FIGS. 7 and 8. Regarding the high-frequency module 1c and the communication device 300 according to Embodiment 3, the same constituent elements as those of the high-frequency module 1 and the communication device 300 according to Embodiment 1 are denoted by the same reference signs, and description thereof will be omitted.

The high-frequency module 1c according to Embodiment 3 is different from the high-frequency module 1 according to Embodiment 1 in that the high-frequency module 1c includes an output matching circuit 2c instead of the output matching circuit 2 of the high-frequency module 1 according to Embodiment 1. In addition, the high-frequency module 1c according to Embodiment 3 is different from the high-frequency module 1 according to Embodiment 1 in that the high-frequency module 1c includes an input matching circuit 3c instead of the input matching circuit 3 of the high-frequency module 1 according to Embodiment 1.

The output matching circuit 2c includes an adjustment unit 23c instead of the adjustment unit 23 of the output matching circuit 2. The circuit configuration of the adjustment unit 23c is similar to the circuit configuration of the adjustment unit 23. In the output matching circuit 2c, the main line 21 is provided in an IC chip 20c including the adjustment unit 23c, and the sub-line 22 is disposed on the mounting substrate 9. The high-frequency module 1c has a dielectric portion 96c between the main line 21 and the sub-line 22. The dielectric portion 96c is formed of, for example, a part of an underfill portion interposed between the IC chip 20c and the first main surface 91 of the mounting substrate 9 in the thickness direction D1 of the mounting substrate 9.

In the output matching circuit 2c, the first switch S1 and the plurality of second switches S2 to S4 are connected to the main line 21 in the IC chip 20c including the adjustment unit 23c. The material of the main line 21 includes, for example, an Al alloy, but is not limited thereto.

In the output matching circuit 2c, the second end 212 of the main line 21 and the first end 221 of the sub-line 22 are connected to each other via a bump 29. In addition, in the output matching circuit 2c, the terminal 24 and the first main surface 91 of the mounting substrate 9 are connected by a bump 109.

The bumps 29 and 109 are, for example, solder bumps. When solder bumps are employed as the bumps 29 and 109, the high-frequency module 1c preferably further includes a resist layer 28c having a predetermined pattern on the sub-line 22. The resist layer 28c has a predetermined pattern determined so as to expose the second end 212 of the sub-line 22. The resist layer 28c has an electrical insulating property. The resist layer 28c has solder wettability lower than that of the sub-line 22. The resist layer 28c is, for example, a solder resist. As such, in the high-frequency module 1c, when the IC chip 20c is mounted on the mounting substrate 9, it is possible to suppress the solder from spreading out on the sub-line 22.

The bumps 29 and 109 are not limited to solder bumps and may be, for example, gold bumps or copper bumps.

The input matching circuit 3c includes an adjustment unit 33c instead of the adjustment unit 33 of the input matching circuit 3. The circuit configuration of the adjustment unit 33c is similar to the circuit configuration of the adjustment unit 33. In the input matching circuit 3c, the main line 31 is provided in an IC chip 30c including the adjustment unit 33c, and the sub-line 32 is disposed on the mounting substrate 9. The high-frequency module 1c has a dielectric portion 97c between the main line 31 and the sub-line 32. The dielectric portion 97c is formed of, for example, a part of an underfill portion interposed between the IC chip 30c and the second main surface 92 of the mounting substrate 9 in the thickness direction D1 of the mounting substrate 9.

In the input matching circuit 3c, the first switch S5 and the plurality of second switches S6 to S8 are connected to the main line 31 in the IC chip 30c including the adjustment unit 33c. The material of the main line 31 includes, for example, an Al alloy, but is not limited thereto.

In the input matching circuit 3c, the second end 312 of the main line 31 and the first end 321 of the sub-line 32 are connected to each other via a bump 39. In addition, in the input matching circuit 3c, the terminal 34 and the second main surface 92 of the mounting substrate 9 are connected by a bump 110.

The bumps 39 and 110 are, for example, solder bumps. When solder bumps are employed as the bumps 39 and 110, the high-frequency module 1c preferably further includes a resist layer 38c having a predetermined pattern on the sub-line 32. The resist layer 38c has a predetermined pattern determined so as to expose the second end 312 of the sub-line 32. The resist layer 38c has an electrical insulating property. The resist layer 38c has solder wettability lower than that of the sub-line 32. The resist layer 38c is, for example, a solder resist. As such, in the high-frequency module 1c, when the IC chip 30c is mounted on the mounting substrate 9, it is possible to suppress the solder from spreading out on the sub-line 32.

The bumps 39 and 110 are not limited to solder bumps and may be, for example, gold bumps or copper bumps.

The high-frequency module 1c according to Embodiment 3 can be miniaturized as in the high-frequency module 1 according to Embodiment 1. Further, in the high-frequency module 1c according to Embodiment 3, the flexibility of the layout of the conductor portions in the mounting substrate 9 is increased.

In addition, since the communication device 300 according to Embodiment 3 includes the high-frequency module 1c and the signal processing circuit 301, it is possible to achieve miniaturization.

Embodiment 4

Figure 9:
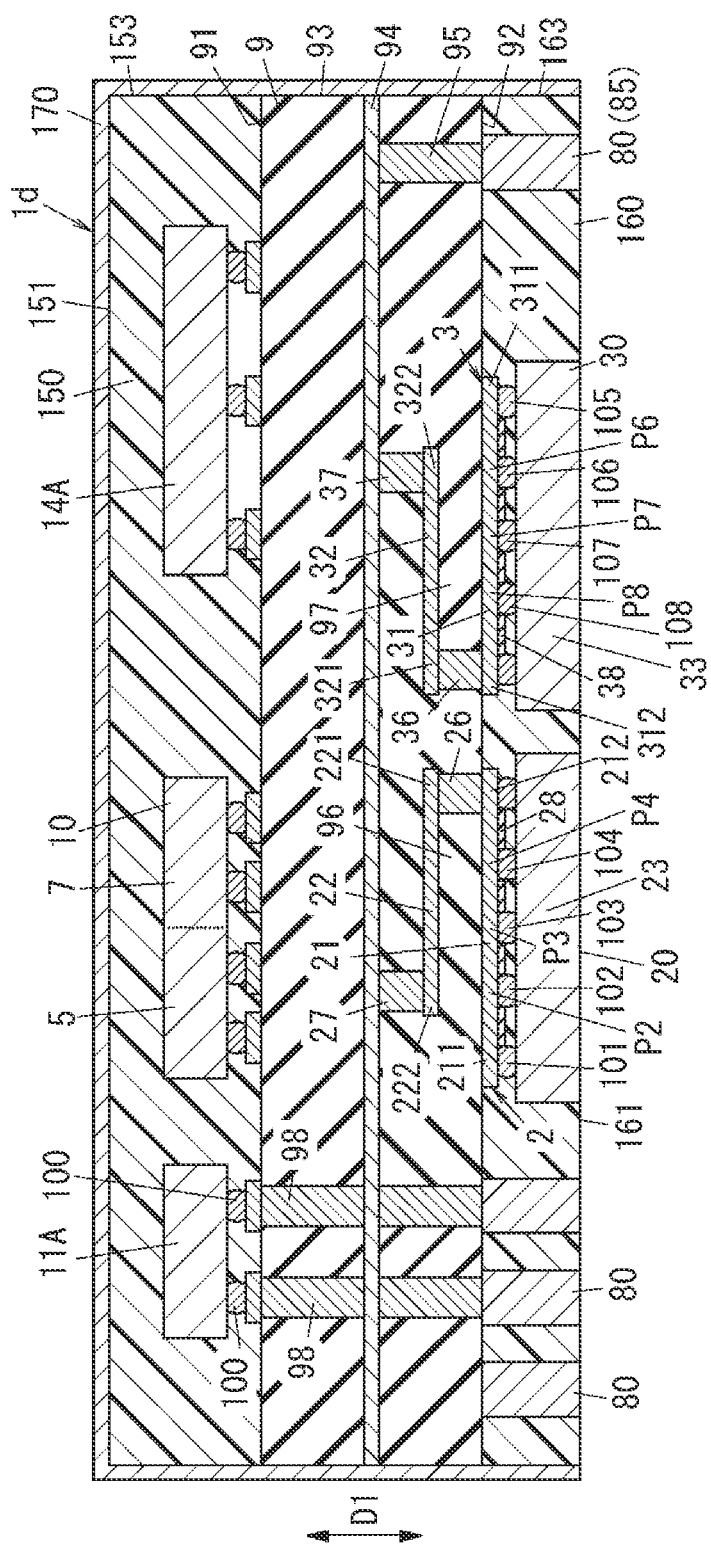
FIG. 9 is a cross-sectional view of a high-frequency module according to Embodiment 4.

A high-frequency module 1d according to Embodiment 4 will be described with reference to FIG. 9. Regarding the high-frequency module 1d according to Embodiment 4, the same constituent elements as those of the high-frequency module 1 according to Embodiment 1 are denoted by the same reference signs, and the description thereof will be omitted.

The high-frequency module 1d according to Embodiment 4 is different from the high-frequency module 1 according to Embodiment 1 in that the power amplifier 11A is disposed on the first main surface 91 of the mounting substrate 9, whereas the IC chip 20 is disposed on the second main surface 92 of the mounting substrate 9. As such, in the high-frequency module 1d according to Embodiment 4, the power amplifier 11A and the IC chip 20 are disposed on different main surfaces from each other of the first main surface 91 and the second main surface 92 of the mounting substrate 9.

In the high-frequency module 1d according to Embodiment 4, the IC chip 10 including the band select switch 5 and the input-side switch 7 is disposed on the first main surface 91 of the mounting substrate 9, but is not limited thereto, and may be disposed on the second main surface 92 of the mounting substrate 9.

The high-frequency module 1d according to Embodiment 4 can be miniaturized as in the high-frequency module 1 according to Embodiment 1.

The high-frequency module 1d according to Embodiment 4 may be used instead of the high-frequency module 1 in the communication device 300 according to Embodiment 1.

The above-described Embodiments 1 to 4 and the like are merely one of various embodiments of the present disclosure. The above-described Embodiments 1 to 4 and the like can be variously modified in accordance with the design and the like as long as the possible benefit of the present disclosure can be achieved.

For example, in the high-frequency module 1, the adjustment unit 23 includes the plurality of second switches S2 to S4, but is not limited thereto, and may include only one second switch among the plurality of second switches S2 to S4. Further, in the high-frequency module 1, the adjustment unit 33 includes the plurality of second switches S6 to S8, but is not limited thereto, and may include only one second switch among the plurality of second switches S6 to S8.

In addition, the filters such as the transmission filters 13A and 13B and the reception filters 14A and 14B are not limited to ladder filters, and may be longitudinally coupled resonator-type surface acoustic wave filters, for example.

In addition, the above-described acoustic wave filter is an acoustic wave filter using a surface acoustic wave or a bulk acoustic wave, but is not limited thereto, and may be, for example, an acoustic wave filter using boundary acoustic waves, plate waves, or the like.

The circuit configurations of the high-frequency modules 1 to 1d are not limited to the above-described examples. In addition, each of the high-frequency modules 1 to 1d may have, as a circuit configuration, for example, a high-frequency front end circuit corresponding to MIMO (Multi Input Multi Output).

In addition, although the high-frequency module 1 includes a set of the power amplifier 11A and the output matching circuit 2 and a set of the low-noise amplifier 12 and the input matching circuit 3, the high-frequency module 1 may include at least one set.

(Aspect)

The following aspects are disclosed herein.

A high-frequency module (1; 1a; 1b; 1c; 1d) according to a first aspect includes a mounting substrate (9), an amplifier (11A, 12), and a matching circuit (2; 2b; 2c, 3; 3b; 3c). The mounting substrate (9) has a first main surface (91) and a second main surface (92) facing each other. The amplifier (11A, 12) is disposed on one main surface (first main surface 91, second main surface 92) of the first main surface (91) and the second main surface (92) of the mounting substrate (9). The amplifier (11A, 12) has an input terminal (111, 121) and an output terminal (112, 122). The matching circuit (2; 2b; 2c, 3; 3b; 3c) is connected to a connection terminal (output terminal 112, input terminal 121) that is one of the input terminal (111, 121) and the output terminal (112, 122) of the amplifier (11A, 12). The mounting substrate (9) has a ground layer (94). The matching circuit (2; 2b; 2c, 3; 3b; 3c) includes a main line (21, 31), a sub-line (22, 32), and an IC chip (20; 20b; 20c, 30; 30b; 30c). The main line (21, 31) is connected to the connection terminal (output terminal 112, input terminal 121) of the amplifier (11A, 12). The sub-line (22, 32) is connected between the main line (21, 31) and the ground layer (94). The sub-line (22, 32) is opposed to the main line (21, 31) in a thickness direction (D1) of the mounting substrate (9). The IC chip (20; 20b; 20c, 30; 30b; 30c) is disposed on the mounting substrate (9). The IC chip (20; 20b; 20c, 30; 30b; 30c) includes an adjustment unit (23; 23b; 23c, 33; 33b; 33c). The adjustment unit (23; 23b; 23c, 33; 33b; 33c) adjusts the impedance conversion characteristics of the matching circuit (2; 2b; 2c, 3; 3b; 3c).

The high-frequency module (1; 1a; 1b; 1c; 1d) according to the first aspect can be miniaturized.

In a high-frequency module (1; 1a; 1b; 1c; 1d) according to a second aspect, in the first aspect, at least a part of each of the main line (21, 31) and the sub-line (22, 32) overlaps the IC chip (20; 20b; 20c, 30; 30b; 30c) in a plan view from the thickness direction (D1) of the mounting substrate (9).

The high-frequency module (1; 1a; 1b; 1c; 1d) according to the second aspect can be further miniaturized.

In a high-frequency module (1; 1a; 1c; 1d) according to a third aspect, in the first or second aspect, the main line (21, 31) has a first end (211, 311) connected to the connection terminal (output terminal 112, input terminal 121) of the amplifier (11A, 12) and a second end (212, 312) connected to the sub-line (22, 32). The adjustment unit (23; 23c, 33; 33c) includes a first switch (S1, S5) and one second switch (any one of S2 to S4, any one of S6 to S8). The first switch (S1, S5) is connected between the first end (211, 311) of the main line (21, 31) and the connection terminal (output terminal 112, input terminal 121). The second switch (any one of S2 to S4, any one of S6 to S8) is connected between a portion separated from both the first end (211, 311) and the second end (212, 312) in the main line (21, 31) and the connection terminal (output terminal 112, input terminal 121).

The high-frequency module (1; 1a; 1c; 1d) according to the third aspect can adjust the impedance by switching between the first switch (S1, S5) and the second switch (any one of S2 to S4, any one of S6 to S8).

In a high-frequency module (1; 1a; 1c; 1d) according to a fourth aspect, in the first or second aspect, the main line (21, 31) has the first end (211, 311) connected to the connection terminal (output terminal 112, input terminal 121) of the amplifier (11A, 12) and the second end (212, 312) connected to the sub-line (22, 32). The adjustment unit (23) includes the first switch (S1, S5) and the plurality of second switches (S2 to S4, S6 to S8). The first switch (S1, S5) is connected between the first end (211, 311) of the main line (21, 31) and the connection terminal (output terminal 112, input terminal 121). The plurality of second switches (S2 to S4, S6 to S8) is connected between a plurality of portions (P2 to P4, P6 to P8) having respective different line lengths from the second end (212, 312) in the main line (21, 31) and the connection terminal (output terminal 112, input terminal 121).

The high-frequency module (1; 1*a*; 1*c*; 1*d*) according to the fourth aspect can adjust the impedance by switching between the first switch (S1, S5) and the plurality of second switches (S2 to S4, S6 to S8).

In a high-frequency module (1*b*) according to a fifth aspect, in the first or second aspect, the sub-line (22, 32) has a first end (221, 321) connected to the main line (21, 31) and a second end (222, 322) connected to the ground layer (94). The adjustment unit (23*b*, 33*b*) includes one switch (any one of Q1 to Q3, any one of Q4 to Q6) connected between a portion separated from both the first end (221, 321) and the second end (222, 322) in the sub-line (22, 32) and the ground layer (94).

In the high-frequency module (1*b*) according to the fifth aspect, the impedance conversion characteristics of the matching circuit (2*b*, 3*b*) can be made different between a case where one switch (any one of Q1 to Q3, any one of Q4 to Q6) is in the ON state and a case where one switch is in the OFF state.

In a high-frequency module (1*b*) according to a sixth aspect, in the first or second aspect, the sub-line (22, 32) has the first end (221, 321) connected to the main line (21, 31) and the second end (222, 322) connected to the ground layer (94). The adjustment unit (23*b*, 33*b*) includes the plurality of switches (Q1 to Q3, Q4 to Q6) connected between the ground layer (94) and a plurality of portions (N1 to N3, N4 to N6) having respective different line lengths from the first end (221, 321) in the sub-line (22, 32).

In the high-frequency module (1*b*) according to the sixth aspect, the impedance conversion characteristics can be adjusted by appropriately switching the plurality of switches (Q1 to Q3, Q4 to Q6).

A high-frequency module (1; 1*a*; 1*c*; 1*d*) according to a seventh aspect includes a mounting substrate (9), an amplifier (11A, 12), and a matching circuit (2; 2*c*; 3; 3*c*). The mounting substrate (9) has a first main surface (91) and a second main surface (92) facing each other. The amplifier (11A, 12) is disposed on one main surface (first main surface 91, second main surface 92) of the first main surface (91) and the second main surface (92) of the mounting substrate (9). The amplifier (11A, 12) has an input terminal (111, 121) and an output terminal (112, 122). The matching circuit (2; 2*c*; 3; 3*c*) is connected to a connection terminal (output terminal 112, input terminal 121) that is one of the input terminal (111, 121) and the output terminal (112, 122) of the amplifier (11A, 12). The mounting substrate (9) has a ground layer (94). The matching circuit (2; 2*c*; 3; 3*c*) includes a main line (21, 31), a sub-line (22, 32), and an IC chip (20; 20*c*; 30; 30*c*). The main line (21, 31) is connected to the connection terminal (output terminal 112, input terminal 121) of the amplifier (11A, 12). The sub-line (22, 32) is connected between the main line (21, 31) and the ground layer (94). The sub-line (22, 32) is opposed to the main line (21, 31) in a thickness direction (D1) of the mounting substrate (9). The IC chip (20; 20*c*; 30; 30*c*) is disposed on the mounting substrate (9). The main line (21, 31) has a first end (211, 311) connected to the connection terminal (output terminal 112, input terminal 121) of the amplifier (11A, 12) and a second end (212, 312) connected to the sub-line (22, 32). The IC chip (20; 20*c*; 30; 30*c*) includes a first switch (S1, S5) and a second switch (at least one of S2 to S4, at least one of S6 to S8). The first switch (S1, S5) is connected between the first end (211, 311) of the main line (21, 31) and the connection terminal (output terminal 112, input terminal 121). The second switch (at least one of S2 to S4, at least one of S6 to S8) is connected between a portion (at least one of P2 to P4, at least one of P6 to P8) separated from both the first end (211, 311) and the second end (212, 312) in the main line (21, 31) and the connection terminal (output terminal 112, input terminal 121).

The high-frequency module (1; 1*a*; 1*c*; 1*d*) according to the seventh aspect can be miniaturized.

A high-frequency module (1*b*) according to an eighth aspect includes a mounting substrate (9), an amplifier (11A, 12), and a matching circuit (2*b*, 3*b*). The mounting substrate (9) has a first main surface (91) and a second main surface (92) facing each other. The amplifier (11A, 12) is disposed on one main surface (first main surface 91, second main surface 92) of the first main surface (91) and the second main surface (92) of the mounting substrate (9). The amplifier (11A, 12) has an input terminal (111, 121) and an output terminal (112, 122). The matching circuit (2*b*, 3*b*) is connected to a connection terminal (output terminal 112, input terminal 121) that is one of the input terminal (111, 121) and the output terminal (112, 122) of the amplifier (11A, 12). The mounting substrate (9) has a ground layer (94). The matching circuit (2*b*, 3*b*) includes a main line (21, 31), a sub-line (22, 32), and an IC chip (20*b*, 30*b*). The main line (21, 31) is connected to the connection terminal (output terminal 112, input terminal 121) of the amplifier (11A, 12). The sub-line (22, 32) is connected between the main line (21, 31) and the ground layer (94). The sub-line (22, 32) is opposed to the main line (21, 31) in a thickness direction (D1) of the mounting substrate (9). The IC chip (20*b*, 30*b*) is disposed on the mounting substrate (9). The sub-line (22, 32) has a first end (221, 321) connected to the main line (21, 31) and a second end (222, 322) connected to the ground layer (94). The IC chip (20*b*, 30*b*) includes a switch (at least one of Q1 to Q3, at least one of Q4 to Q6). The switch (at least one of Q1 to Q3, at least one of Q4 to Q6) is connected between a portion separated from both the first end (221, 321) and the second end (222, 322) in the sub-line (22, 32) and the ground layer (94).

The high-frequency module (1*b*) according to the eighth aspect can be miniaturized.

In a high-frequency module (1; 1*a*) according to a ninth aspect, in any one of the first to eighth aspects, the main line (21, 31) is disposed on the main surface (first main surface 91, second main surface 92) of the mounting substrate (9) on which the amplifier (11A, 12) is disposed. The sub-line (22, 32) is disposed between the first main surface (91) and the second main surface (92) of the mounting substrate (9) so as to be separated from the first main surface (91) and the second main surface (92).

In the high-frequency module (1; 1*a*) according to the ninth aspect, the main line (21, 31) and the sub-line (22, 32) can be formed integrally with the mounting substrate (9).

In a high-frequency module (1*b*) according to a tenth aspect, in any one of the first to eighth aspects, the main line (21, 31) is disposed between the first main surface (91) and the second main surface (92) of the mounting substrate (9) so as to be separated from the first main surface (91) and the second main surface (92). The sub-line (22, 32) is disposed on the main surface (the first main surface 91, the second main surface 92) of the mounting substrate (9) on which the amplifier (11A, 12) is disposed.

In the high-frequency module (1*b*) according to the tenth aspect, the main line (21, 31) and the sub-line (22, 32) can be formed integrally with the mounting substrate (9).

In a high-frequency module (1*c*) according to an eleventh aspect, in any one of the first to eighth aspects, the main line (21, 31) is provided in the IC chip (20c, 30c). The sub-line (22, 32) is disposed on the mounting substrate (9).

The high-frequency module (1c) according to the eleventh aspect has an advantage that the main line (21, 31) does not need to be provided on the mounting substrate (9).

In a high-frequency module (1; 1a; 1b; 1c; 1d) according to a twelfth aspect, in any one of the first to eleventh aspects, the amplifier is a power amplifier (11A) and is disposed on the first main surface (91) of the mounting substrate (9). The matching circuit (2; 2b; 2c) is connected to the output terminal (112) of the amplifier.

In the high-frequency module (1; 1a; 1b; 1c; 1d) according to the twelfth aspect, it is possible to adjust the impedance of the matching circuit (2; 2b; 2c) connected to the output terminal (112) of the power amplifier (11A).

A high-frequency module (1; 1a; 1b; 1c; 1d) according to a thirteenth aspect, in the twelfth aspect, further includes a plurality of transmission filters (13A, 13B) and a band select switch (5). The plurality of transmission filters (13A, 13B) has pass bands different from each other. The plurality of transmission filters (13A, 13B) is disposed on the mounting substrate (9). The band select switch (5) has a common terminal (50) and a plurality of selection terminals (51). In the band select switch (5), the amplifier (11A) is connected to the common terminal (50) via the matching circuit (2; 2b; 2c), and the plurality of transmission filters (13A, 13B) is connected to the plurality of selection terminals (51). The band select switch (5) is included in the IC chip (20; 20b; 20c).

The high-frequency module (1; 1a; 1b; 1c; 1d) according to the thirteenth aspect can be miniaturized.

A high-frequency module (1; 1a; 1b; 1c; 1d) according to a fourteenth aspect, in the thirteenth aspect, includes a plurality of the amplifiers and further includes an input-side switch (7). The input-side switch (7) has a common terminal (70) and a plurality of selection terminals (71). In the input-side switch (7), a signal input terminal (82) is connected to the common terminal (70), and the input terminal (111) of the plurality of amplifiers (11A, 11B) is connected to the plurality of selection terminals (71). The input-side switch (7) is included in the IC chip (20; 20b; 20c).

In a high-frequency module (1; 1a; 1b; 1c; 1d) according to a fifteenth aspect, in the thirteenth or fourteenth aspect, the mounting substrate (9) includes a plurality of via conductors (98) connected to the amplifier (11A) and overlapping the amplifier (11A) in the thickness direction (D1) of the mounting substrate (9). In the high-frequency module (1; 1a; 1b; 1c; 1d), the amplifier (11A) and the IC chip (20; 20b; 20c) do not overlap each other in a plan view from the thickness direction (D1) of the mounting substrate (9).

In the high-frequency module (1; 1a; 1b; 1c; 1d) according to the fifteenth aspect, the heat generated in the amplifier (11A) is easily dissipated.

In a high-frequency module (1; 1a; 1b; 1c) according to a sixteenth aspect, in the fifteenth aspect, the IC chip (20) is disposed on the first main surface (91) of the mounting substrate (9).

In a high-frequency module (1d) according to a seventeenth aspect, in the fifteenth aspect, the IC chip (20) is disposed on the second main surface (92) of the mounting substrate (9).

In a high-frequency module (1; 1a; 1b; 1c; 1d) according to an eighteenth aspect, in any one of the first to eleventh aspects, the amplifier (12) is a low-noise amplifier. The amplifier (12) is disposed on the second main surface (92) of the mounting substrate (9). The matching circuit (3; 3b; 3c; 3d) is connected to the input terminal (121) of the amplifier (12).

In the high-frequency module (1; 1a; 1b; 1c; 1d) according to the eighteenth aspect, the impedance of the matching circuit (3; 3b; 3c) connected to the input terminal (121) of the amplifier (12) can be adjusted.

A high-frequency module (1; 1a; 1b; 1c; 1d) according to a nineteenth aspect, in the eighteenth aspect, further includes a plurality of reception filters (14A, 14B) and a band select switch (6). The plurality of reception filters (14A, 14B) has pass bands different from each other. The plurality of reception filters (14A, 14B) is disposed on the mounting substrate (9). The band select switch (6) has a common terminal (60) and a plurality of selection terminals (61). In the band select switch (6), the amplifier (12) is connected to the common terminal (60) via the matching circuit (3), and the plurality of reception filters (14A, 14B) is connected to the plurality of selection terminals (61). The amplifier (12) and the band select switch (6) are included in the IC chip (30; 30b; 30c).

The high-frequency module (1; 1a; 1b; 1c; 1d) according to the nineteenth aspect can be miniaturized.

In a high-frequency module (1; 1a; 1b; 1c; 1d) according to a twentieth aspect, in the nineteenth aspect, the amplifier (12) and at least one reception filter (14A) of the plurality of reception filters (14A, 14B) overlap each other in a plan view from the thickness direction (D1) of the mounting substrate (9).

In the high-frequency module (1; 1a; 1b; 1c; 1d) according to the twentieth aspect, it is possible to reduce the length of wiring that connects the amplifier (12) and at least one reception filter (14A) of the plurality of reception filters (14A, 14B).

A high-frequency module (1; 1a; 1b; 1c; 1d) according to a twenty first aspect, in any one of the first to twentieth aspects, further includes an external connection terminal (80). The external connection terminal (80) is disposed on the second main surface (92) of the mounting substrate (9).

A communication device (300) according to a twenty second aspect includes the high-frequency module (1; 1a; 1b; 1c; 1d) according to any one of the first to twenty first aspects and a signal processing circuit (301). The signal processing circuit (301) is connected to the high-frequency module (1; 1a; 1b; 1c; 1d) and performs signal processing on the high-frequency signal.

In the communication device (300) according to the twenty second aspect, it is possible to achieve miniaturization.

1, 1a, 1b, 1c, 1d HIGH-FREQUENCY MODULE
2, 2b, 2c OUTPUT MATCHING CIRCUIT (MATCHING CIRCUIT)
20, 20b, 20c IC CHIP
21 MAIN LINE
22 SUB-LINE
23, 23b, 23c ADJUSTMENT UNIT
24 TERMINAL
25 TERMINAL
26 VIA CONDUCTOR
27 VIA CONDUCTOR
28 RESIST LAYER
28b RESIST LAYER
28c RESIST LAYER
29 BUMP
3, 3b, 3c INPUT MATCHING CIRCUIT (MATCHING CIRCUIT)
30, 30b, 30c IC CHIP

31 MAIN LINE
32 SUB-LINE
33, 33b, 33c ADJUSTMENT UNIT
34 TERMINAL
35 TERMINAL
36 VIA CONDUCTOR
37 VIA CONDUCTOR
38 RESIST LAYER
38b RESIST LAYER
38c RESIST LAYER
39 BUMP
4 ANTENNA SWITCH
40 COMMON TERMINAL
41 SELECTION TERMINAL
5 BAND SELECT SWITCH
50 COMMON TERMINAL
51 SELECTION TERMINAL
6 BAND SELECT SWITCH
60 COMMON TERMINAL
61 SELECTION TERMINAL
7 INPUT-SIDE SWITCH
70 COMMON TERMINAL
71 SELECTION TERMINAL
9 MOUNTING SUBSTRATE
91 FIRST MAIN SURFACE
92 SECOND MAIN SURFACE
93 OUTER PERIPHERAL SURFACE
94 GROUND LAYER
95 VIA CONDUCTOR
96, 96c DIELECTRIC PORTION
97, 97c DIELECTRIC PORTION
98 VIA CONDUCTOR
10 IC CHIP
11A POWER AMPLIFIER (AMPLIFIER)
11B POWER AMPLIFIER
111 INPUT TERMINAL
112 OUTPUT TERMINAL (CONNECTION TERMINAL)
12 LOW-NOISE AMPLIFIER (AMPLIFIER)
121 INPUT TERMINAL (CONNECTION TERMINAL)
122 OUTPUT TERMINAL
13A, 13B TRANSMISSION FILTER
14A, 14B RECEPTION FILTER
15A DUPLEXER
15B DUPLEXER
16 CONTROLLER
80 EXTERNAL CONNECTION TERMINAL
81 ANTENNA TERMINAL
82 SIGNAL INPUT TERMINAL
83 SIGNAL OUTPUT TERMINAL
85 GROUND TERMINAL
100 to 104 BUMP
105 to 108 BUMP
109 BUMP
110 BUMP
131 to 133 BUMP
134 to 136 BUMP
150 FIRST RESIN LAYER
151 MAIN SURFACE
153 OUTER PERIPHERAL SURFACE
160 SECOND RESIN LAYER
161 MAIN SURFACE
163 OUTER PERIPHERAL SURFACE
170 SHIELD LAYER
193 UNDERFILL PORTION
300 COMMUNICATION DEVICE
301 SIGNAL PROCESSING CIRCUIT
302 RF SIGNAL PROCESSING CIRCUIT
303 BASEBAND SIGNAL PROCESSING CIRCUIT
310 ANTENNA
D1 THICKNESS DIRECTION
N1 to N3 PORTION
P2 to P4 PORTION
Q1 to Q3 SWITCH
Q4 to Q6 SWITCH
S1 FIRST SWITCH
S2 to S4 SECOND SWITCH
S5 FIRST SWITCH
S6 to S8 SECOND SWITCH

The invention claimed is:

1. A high-frequency module comprising:
a mounting substrate having a first main surface and a second main surface facing each other;
at least one amplifier disposed on one main surface of the first main surface and the second main surface of the mounting substrate, the amplifier having an input terminal and an output terminal; and
a matching circuit connected to a connection terminal being one of the input terminal and the output terminal of the amplifier,
wherein the mounting substrate includes a ground layer,
wherein the matching circuit includes:
a main line comprised of a first conductor pattern intersecting a thickness direction of the mounting substrate and connected to the connection terminal of the amplifier;
a sub-line comprised of a second conductor pattern intersecting the thickness direction, connected between the main line and the ground layer, and opposed to the main line in the thickness direction; and
an IC chip disposed on the mounting substrate and including an adjustment unit configured to adjust impedance conversion characteristics of the matching circuit,
wherein the main line has a first end connected to the connection terminal of the amplifier and a second end connected to the sub-line, and
wherein the adjustment unit includes:
a first switch connected between the first end of the main line and the connection terminal; and
one second switch connected between the connection terminal and a portion separated from both the first end and the second end in the main line.

2. The high-frequency module according to claim 1, wherein at least a part of each of the main line and the sub-line overlaps the IC chip in a plan view from the thickness direction of the mounting substrate.

3. The high-frequency module according to claim 1, further comprising a plurality of second switches connected between the connection terminal and a plurality of portions having respective different line lengths from the second end in the main line.

4. The high-frequency module according to claim 1, wherein the sub-line has a first end connected to the main line and a second end connected to the ground layer, and
the adjustment unit includes one switch connected between the ground layer and a portion separated from both the first end and the second end in the sub-line.

5. The high-frequency module according to claim 1, wherein the sub-line has a first end connected to the main line and a second end connected to the ground layer, and the adjustment unit includes a plurality of switches connected between the ground layer and a plurality of portions having respective different line lengths from the first end in the sub-line.

6. A high-frequency module comprising:

a mounting substrate having a first main surface and a second main surface facing each other;

an amplifier disposed on one main surface of the first main surface and the second main surface of the mounting substrate, the amplifier having an input terminal and an output terminal; and a matching circuit connected to a connection terminal being one of the input terminal and the output terminal of the amplifier, wherein the mounting substrate includes a ground layer, wherein the matching circuit includes:

a main line comprised of a first conductor pattern intersecting a thickness direction of the mounting substrate and connected to the connection terminal of the amplifier;

a sub-line comprised of a second conductor pattern intersecting the thickness direction, connected between the main line and the ground layer, and opposed to the main line in the thickness direction; and an IC chip disposed on the mounting substrate, wherein the sub-line has a first end connected to the main line and a second end connected to the ground layer, wherein the IC chip includes a switch connected between the ground layer and a portion separated from both the first end and the second end in the sub-line, wherein the main line is disposed between the first main surface and the second main surface of the mounting substrate so as to be separated from the first main surface and the second main surface, and wherein the sub-line is disposed on the main surface of the mounting substrate on which the amplifier is disposed.

7. The high-frequency module according to claim 1, wherein the main line is disposed on the main surface of the mounting substrate on which the amplifier is disposed, and the sub-line is disposed between the first main surface and the second main surface of the mounting substrate so as to be separated from the first main surface and the second main surface.

8. The high-frequency module according to claim 1, wherein the main line is disposed between the first main surface and the second main surface of the mounting substrate so as to be separated from the first main surface and the second main surface, and the sub-line is disposed on the main surface of the mounting substrate on which the amplifier is disposed.

9. The high-frequency module according to claim 1, wherein the main line is provided in the IC chip, and the sub-line is disposed on the mounting substrate.

10. The high-frequency module according to claim 1, wherein the amplifier is a power amplifier and is disposed on the first main surface of the mounting substrate, and the matching circuit is connected to the output terminal of the amplifier.

11. The high-frequency module according to claim 10, further comprising:

a plurality of transmission filters having pass bands different from each other and disposed on the mounting substrate; and a band select switch having a common terminal and a plurality of selection terminals, wherein the amplifier is connected to the common terminal via the matching circuit, and the plurality of transmission filters is connected to the plurality of selection terminals, wherein the band select switch is included in the IC chip.

12. The high-frequency module according to claim 11, wherein the amplifier includes a plurality of amplifiers, wherein the high-frequency module further comprises an input-side switch having a common terminal and a plurality of selection terminals, wherein a signal input terminal is connected to the common terminal, and the input terminals of the plurality of amplifiers are connected to the plurality of selection terminals, wherein the input-side switch is included in the IC chip.

13. The high-frequency module according to claim 11, wherein the mounting substrate includes a plurality of via conductors connected to the amplifier and overlapping the amplifier in the thickness direction of the mounting substrate, and the amplifier and the IC chip do not overlap each other in a plan view from the thickness direction of the mounting substrate.

14. The high-frequency module according to claim 13, wherein the IC chip is disposed on the first main surface of the mounting substrate.

15. The high-frequency module according to claim 13, wherein the IC chip is disposed on the second main surface of the mounting substrate.

16. The high-frequency module according to claim 1, wherein the amplifier is a low-noise amplifier and is disposed on the second main surface of the mounting substrate, and the matching circuit is connected to the input terminal of the amplifier.

17. The high-frequency module according to claim 16, further comprising:

a plurality of reception filters having pass bands different from each other and disposed on the mounting substrate; and a band select switch having a common terminal and a plurality of selection terminals, wherein the amplifier is connected to the common terminal via the matching circuit and the plurality of reception filters is connected to the plurality of selection terminals, wherein the amplifier and the band select switch are included in the IC chip.

18. The high-frequency module according to claim 17, wherein the amplifier overlaps at least one reception filter of the plurality of reception filters in a plan view from the thickness direction of the mounting substrate.

19. The high-frequency module according to claim 1, further comprising an external connection terminal disposed on the second main surface of the mounting substrate.

20. A communication device comprising:

the high-frequency module according to claim 1; and a signal processing circuit connected to the high-frequency module and configured to perform signal processing on a high-frequency signal.

* * * * *